(12) United States Patent
Bell et al.

(10) Patent No.: US 11,186,494 B2
(45) Date of Patent: Nov. 30, 2021

(54) METHOD OF MAKING ROOM TEMPERATURE STABLE δ-PHASE BISMUTH(III) OXIDE

(71) Applicant: CORNELL UNIVERSITY, Ithaca, NY (US)

(72) Inventors: Robert Bell, Denver, CO (US); Marc Murphy, Blaine, MN (US); R. Bruce Van Dover, Ithaca, NY (US); Michael O. Thompson, Ithaca, NY (US); Peter A. Beaucage, Cincinnati, OH (US)

(73) Assignee: CORNELL UNIVERSITY, Ithaca, NY (US)

( * ) Notice: Subject to any disclaimer, the term of this patent is extended or adjusted under 35 U.S.C. 154(b) by 0 days.

(21) Appl. No.: 16/832,626

(22) Filed: Mar. 27, 2020

(65) Prior Publication Data

US 2020/0223711 A1   Jul. 16, 2020

Related U.S. Application Data

(63) Continuation-in-part of application No. PCT/US2018/053731, filed on Oct. 1, 2018.
(Continued)

(51) Int. Cl.
*C01G 29/00* (2006.01)
*G01N 27/406* (2006.01)
(Continued)

(52) U.S. Cl.
CPC .......... *C01G 29/00* (2013.01); *G01N 27/409* (2013.01); *G01N 27/4073* (2013.01);
(Continued)

(58) Field of Classification Search
None
See application file for complete search history.

(56) References Cited

U.S. PATENT DOCUMENTS

| | | | |
|---|---|---|---|
| 4,675,171 | A | 6/1987 | Kubo et al. |
| 5,006,494 | A | 4/1991 | Virkar |
| (Continued) | | | |

FOREIGN PATENT DOCUMENTS

| | | |
|---|---|---|
| CN | 102320657 A | 1/2012 |
| DE | 102012004236 A1 | 9/2013 |
| (Continued) | | |

OTHER PUBLICATIONS

T. Hill, H. Huang, "Fabricating Pinhole-Free YSZ Sub-Microthin Films by Magnetron Sputtering for Micro-SOFCs", International Journal of Electrochemistry, vol. 2011, Article ID 479203, 8 pages, 2011. https://doi.org/10.4061/2011/479203 (Year: 2011).*
(Continued)

*Primary Examiner* — Lucas J. O'Donnell
(74) *Attorney, Agent, or Firm* — Heslin Rothenberg Farley & Mesiti P.C.

(57) ABSTRACT

Provided is room temperature stable δ-phase $Bi_2O_3$. Ion conductive compositions comprise at least 95 wt % δ-phase $Bi_2O_3$, and, at 25° C., the compositions are stable and have a conductivity of at least $10^{-7}$ S/cm. Related methods, electrochemical cells, and devices are also disclosed.

22 Claims, 16 Drawing Sheets

Related U.S. Application Data

(60) Provisional application No. 62/565,769, filed on Sep. 29, 2017.

(51) Int. Cl.

| | | |
|---|---|---|
| H01M 8/1246 | (2016.01) | |
| G01N 27/407 | (2006.01) | |
| G01N 27/409 | (2006.01) | |
| H01M 12/02 | (2006.01) | |
| H01M 12/08 | (2006.01) | |
| H01M 8/124 | (2016.01) | |

(52) U.S. Cl.
CPC ......... H01M 8/1266 (2013.01); H01M 12/02 (2013.01); H01M 12/08 (2013.01); *C01P 2002/60* (2013.01); *C01P 2006/40* (2013.01); *H01M 2008/1293* (2013.01); *H01M 2300/0074* (2013.01)

(56) References Cited

U.S. PATENT DOCUMENTS

| | | |
|---|---|---|
| 5,317,008 A | 5/1994 | Imai |
| 9,252,448 B2 | 2/2016 | Yoon et al. |
| 2003/0130127 A1 | 7/2003 | Hentges et al. |
| 2005/0278939 A1 | 12/2005 | Ayai |
| 2012/0171596 A1 | 7/2012 | Hilliard |

FOREIGN PATENT DOCUMENTS

| | | |
|---|---|---|
| TW | 1373879 B | 10/2012 |
| WO | 2018/037302 A1 | 3/2018 |
| WO | 2019/068079 A1 | 4/2019 |

OTHER PUBLICATIONS

"Stabilization of the δ-Bi2O3-like structure down to room temperature by thermal nanocrystallization of bismuth oxide-based glasses" to TK Pietrzak (Solid State Ionics 323 (2018) 78-8479) (Year: 2018).*

"Laser irradiation-induced α to δ phase transformation in Bi2O3 ceramics and nanowires" to Villa et al.; Appl. Phys. Lett. 101, 071905 (2012); https://doi.org/10.1063/1.4747198 Published Online: Aug. 16, 2012 (Year: 2012).*

Hinklin et al. Liquid-Feed Flame Spray Pyrolysis of Metalloorganic and Inorganic Alumina Sources in the Production of Nanoalumina Powders; Chem. Mater. 2004, 16, 21-30 (Year: 2004).*

Dreyer et al., Decrease of the required dopant concentration for δ-Bi2O3 crystal stabilization through thermal quenching during single-step flame spray pyrolysis; CrystEngComm, 2016, 18, 2046-2056 (Year: 2016).*

High Throughput Sreening of Structural Effects of Millisecond Time Scale Thermal Annealing, Cornell Graduate School Dissertation by R.T. Bell; Aug. 2017 (Year: 2017).*

International Search Report and Written Opinion of the International Searching Authority for International Application No. PCT/US2018/053731 dated Dec. 4, 2018.

Diaz-Guerra, C., et al., "Formation of β-$Bi_2O_3$ and δ-$Bi_2O_3$ during laser irradiation of Bi films studied in-situ by spatially resolved Raman spectroscopy", Journal of Alloys and Compounds (accepted manuscript), vol. 723, pp. 1-26 (2017).

Jung, D.W., "Conductivity and Stability of Bismuth Oxide-Based Electrolytes and their Applications for IT-SOFCS", Doctoral Thesis, University of Florida, pp. 1-188 (2009).

Pietrzak, T.K., et al., "Stabilization of Superionic δ-$Bi_2O_3$ Phase at Room Temperature by Thermal Nanocrystallization of Bismuth Oxide Glasses", $232^{nd}$ ECS Meeting, National Harbor, MD, Oct. 1-5, 2017, Gaylord National Resort and Convention Center.

Popa, P.L., et al., "Highly oriented δ-$Bi_2O_3$ thin films stable at room temperatme synthesized by reactive magnetron sputtering", Journal of Applied Physics, vol. 113, pp. 046101-1-046101-3 (2013).

Sanna, S., et al., "High ionic conductivity in confined bismuth oxide-based heterostructures", APL Materials, vol. 4, 121101-1-121101-5 (2016).

Schröder, F., et al., "Temperature dependence of $Bi_2O_3$ structural parameters close to the α-δ phase transition", Phase Transitions, vol. 83, No. 5, pp. 311-325 (2010).

Thompson, M., Synthesis and Characterisation of δ-$Bi_2O_3$ Related Materials Stabilised by Substitutions of Ca, Ga, Nb and Re, Doctoral Thesis, University of Birmingham, pp. 1-190 (2010).

Skinner, S.J., et al., "Oxygen Ion Conductors", Materials Today, vol. 6, No. 3, pp. 30-37 (2003).

Laurent, K., et al., "Structure and conductivity studies of electrodeposited δ-$Bi_2O_3$", Solid State Ionics, vol. 178, pp. 1735-1739 (2008).

Borowska-Centokowska, A., et al., "Conductivity in lead substituted bismuth yttrate fluorites", author's version prior to publication in Solid State Ionics, 254, 59; doi: 10.1016/j.ssi.2013.11.015 (2014).

Jiang, N., et al., "Structural Stability and Conductivity of Phase-Stabilized Cubic Bismuth Oxides", J. Am. Ceram. Soc., vol. 82, No. 11, pp. 3057-3064 (1999).

* cited by examiner

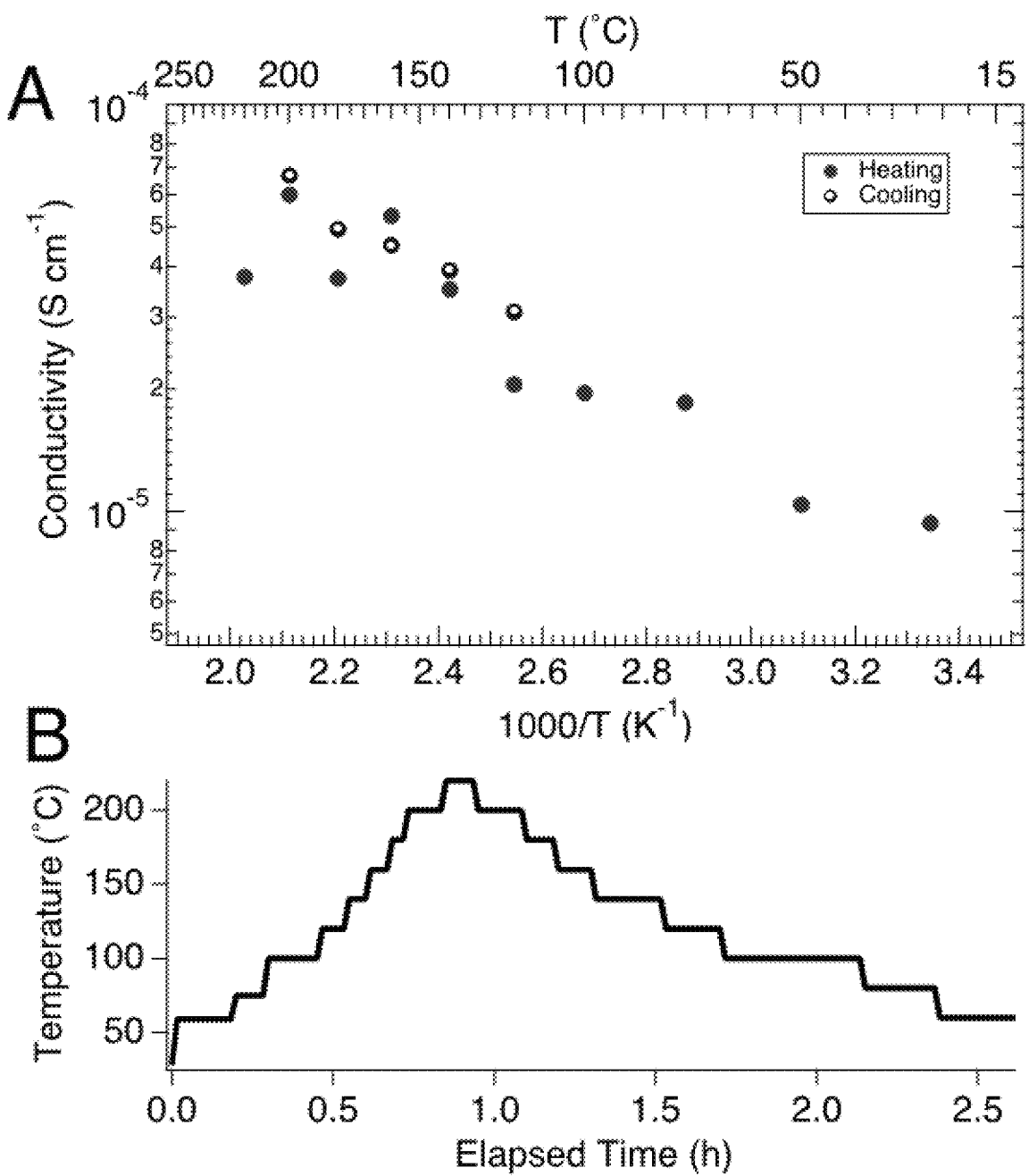
FIGS. 16A-B

METHOD OF MAKING ROOM TEMPERATURE STABLE δ-PHASE BISMUTH(III) OXIDE

CROSS-REFERENCE TO RELATED APPLICATIONS

This application is a continuation in part of International Application No. PCT/US2018/053731, filed on Oct. 1, 2018, and published as WO/2019/068079 on Apr. 4, 2019, which claims priority to U.S. Provisional Patent Application No. 62/565,769, filed Sep. 29, 2017. The disclosures of both of the prior applications are hereby incorporated by reference herein in their entirety.

GOVERNMENT LICENSE RIGHTS

This invention was made with government support under DESC0019445 awarded by the Office of Science (DOE), and under DMR-1719875, DMR-1332208, ECCS-1542081 awarded by the National Science Foundation. The United States Government has certain rights in the invention.

FIELD OF THE INVENTION

This invention relates to δ-phase bismuth(III) oxide ($Bi_2O_3$) that is stable at room temperature (25° C.). Methods of making the δ-phase $Bi_2O_3$, and compositions and apparatuses/devices comprising the δ-phase $Bi_2O_3$ are also disclosed.

BACKGROUND

Solid oxides are ceramic materials characterized as inorganic compounds that contain oxygen. They represent a ubiquitous and indispensable class of materials. Solid oxides, such as silicon dioxide ($SiO_2$), aluminum oxide ($Al_2O_3$), cubic zirconia ($ZrO_2$), and barium titanate ($BaTiO_3$), are key components in a wide range of applications, including electronics, building infrastructure, aviation, medicine, superconductors, insulation, etc.

Some solid oxides are primarily used as electrolyte membranes for various electrochemical devices, for example, solid oxide fuel cells (SOFCs), oxygen sensors, and metal-air batteries. These solid oxide membranes (SOMs) are ion conductive materials capable of rapidly transporting charged oxygen atoms (i.e. oxygen anions ($O^{2-}$)).

The expediency of transporting charged oxygen anions through the SOM is measured by a property known as the ionic conductivity (a), a measurement of oxygen ion diffusion rates. The ionic conductivity of SOMs increases with temperature. Therefore, in order to reach sufficiently high ionic conductivities for optimal performance, most devices that operate with SOMs must be maintained at extremely high temperatures (700-1100° C.), thus severely limiting their use to more stationary-based applications.

Among the SOMs, the best oxygen ion conductor (OIC) is delta-phase bismuth oxide (δ-$Bi_2O_3$). At temperatures above 730° C., δ-$Bi_2O_3$ has the highest known oxygen ion conductivity out of any currently existing SOM. Consequently, δ-$Bi_2O_3$ is a subject of interest as a SOM (including, e.g., for use as a SOFC electrolyte). The high ionic conductivity of δ-$Bi_2O_3$ is primarily attributed to its unique structure at the atomic level, which enables high oxygen ion mobility.

Typically, in state-of-the-art compositions, delta-phase bismuth oxide is only stable within a high and narrow temperature range of 730–825° C. When the temperature is reduced below 730° C., δ-$Bi_2O_3$ transforms into a completely different atomic structure. At ambient pressures, there are two equilibrium phases for $Bi_2O_3$ (α-phase at low temperatures, and δ-phase above 729° C.) and four additional accessible metastable phases (β-, γ-, ε-, and ω-phases). Although δ-$Bi_2O_3$ and other $Bi_2O_3$ phases are comprised of the same material (i.e., the same bismuth and oxygen composition), the different phases are distinguished by the arrangement of atoms therein, resulting in widely disparate properties. For example, α-$Bi_2O_3$ has an ionic conductivity that is about 1000 times less than δ-$Bi_2O_3$ at any given temperature; this is underscored by the near vertical drop of the $Bi_2O_3$ curve shown in FIG. 1. Although keeping the operating temperatures between 730-825° C. will maintain δ-$Bi_2O_3$, the material becomes highly susceptible to accelerated chemical degradation induced by the high temperatures. This is a major challenge that has precluded widespread use of δ-$Bi_2O_3$ as a commercial electrolyte. Near room temperature, oxygen ion conductors would have applications as components in, inter alia, sensors, ion pumps, and electrolytes in batteries and fuel cells; current oxygen ion conductors however are limited to temperatures above 400° C. If one were to stabilize δ-$Bi_2O_3$ to lower temperatures while maintaining its high conductivity, this would not only significantly lessen the issues associated with δ-$Bi_2O_3$ degradation, but would also expand the application of traditionally high temperature devices such as SOFCs to operate at much lower temperatures.

Prior attempts to obtain δ-$Bi_2O_3$ that is stable at lower temperatures include doping, substrate stabilization, and magnetron sputtering. However, none of these attempts have been sufficiently satisfactory. For example, doping lowers $Bi_2O_3$ purity levels, which degrades desirable properties such as conductivity. Substrate stabilization unduly limits the configuration of $Bi_2O_3$ by requiring it to maintain contact with stabilizing substrates, the use of which may be undesirable in a final device where $Bi_2O_3$ is to be employed. Magnetron sputtering results in the presence of pinholes in $Bi_2O_3$, and also can generally lead to multiple $Bi_2O_3$ phases being present in a composition, which is detrimental to conductivity. Indeed, even where others have otherwise attempted to purportedly make lower temperature stable δ-$Bi_2O_3$, the quality and nature of the resultant compositions have generally been so poor that conductivity could not even be measured.

During conventional furnace quenching, δ-$Bi_2O_3$ either transforms into the low temperature stable α polymorph or, for quench rates near $10^{-1}$° C./sec, persists in the δ-phase to 639-650° C. before transforming into the β or γ metastable polymorphs. Both β and γ often transform again into the α-phase as samples approach room temperature. Lacking the open structure of the δ-phase, ionic conductivities in the α, β, and γ polymorphs are 2-7 orders of magnitude lower than in δ-phase $Bi_2O_3$, and hence the δ-phase must be preserved if its ionic conductivity is to be accessed at room temperature.

Direct synthesis of δ-$Bi_2O_3$ at room temperature, with various degrees of phase purity, has been reported by methods including pulsed laser deposition (PLD), electrodeposition, magnetron sputtering, chemical vapor deposition (CVD), metal organic chemical vapor deposition (MOCVD), and carbothermal evaporation. However, the ionic conductivity of pure δ-$Bi_2O_3$ has not been reported below 350° C., likely due to poor phase purity and/or low film quality in these direct synthesis methods.

Thus, a need exists for improved $\delta$-$Bi_2O_3$ compositions capable of remaining stable at lower temperatures (e.g., room temperature), especially while exhibiting desirable properties such as ionic conductivity.

While certain aspects of conventional technologies have been discussed to facilitate disclosure of the invention, Applicant in no way disclaims these technical aspects, and it is contemplated that the claimed invention may encompass one or more of the conventional technical aspects discussed herein.

In this specification, where a document, act or item of knowledge is referred to or discussed, this reference or discussion is not an admission that the document, act or item of knowledge or any combination thereof was, at the priority date, publicly available, known to the public, part of common general knowledge, or otherwise constitutes prior art under the applicable statutory provisions; or is known to be relevant to an attempt to solve any problem with which this specification is concerned.

SUMMARY OF THE INVENTION

Briefly, the present invention satisfies the need for improved $\delta$-$Bi_2O_3$ compositions capable of remaining stable at lower temperatures especially while exhibiting desirable properties such as ionic conductivity.

The invention provides, inter alia, an ion conductive composition comprising $\delta$-phase $Bi_2O_3$, wherein the composition comprises at least 95 wt % $Bi_2O_3$ and, at 25° C., the composition is stable and has a conductivity of at least 10'S/cm. The inventive composition finds non-limiting use as a solid oxide membrane. Methods of making the composition, and articles employing the composition are also provided.

As discussed above, at temperatures above 730° C., delta-phase $Bi_2O_3$ ($\delta$-$Bi_2O_3$) has the highest known oxygen ion conductivity out of any currently existing SOM. However, $\delta$-$Bi_2O_3$ is only stable within a high and narrow temperature range of 730-825° C. This narrow, extremely high temperature window requires operating conditions that can represent an extremely limiting factor for mainstream use of $\delta$-$Bi_2O_3$. Indeed, FIG. 1 depicts the rapid conversion of $\delta$-$Bi_2O_3$ to $\alpha$-$Bi_2O_3$ and the concurrent conductivity plummet as temperature drops below 700° C.

Doping of $Bi_2O_3$ with lanthanides and transition metals has allowed for stabilization of $\delta$-$Bi_2O_3$ during conventional quenches, but this stabilization has come at the cost of considerably reduced ionic conductivity. While direct quenching of pure $\delta$-$Bi_2O_3$ from the stable region above 729° C. to room temperature has been widely explored, to date this has been unsuccessful and has been generally considered to be impossible.

However, the inventors have discovered a new $\delta$-$Bi_2O_3$ composition, embodiments of which are surprisingly able to maintain phase-pure, highly conductive $\delta$-$Bi_2O_3$ at lower temperatures. In particular, the Applicant has discovered that, by heating $Bi_2O_3$ to at least 730° C. and then cooling the material, with a period of rapid cooling from 650° C. to less than or equal to 400° C. within a period of 100 ms or less, the resultant composition remains in the highly conductive $\delta$-phase even at lower temperatures (e.g., room temperature, 25° C.).

Embodiments of the invention may address one or more of the problems and deficiencies discussed above. However, it is contemplated that the invention may prove useful in addressing other problems and deficiencies in a number of technical areas. Therefore, the claimed invention should not necessarily be construed as limited to addressing any of the particular problems or deficiencies discussed herein.

Certain embodiments of the presently-disclosed $\delta$-$Bi_2O_3$ composition and related methods and articles/devices have several features, no single one of which is solely responsible for their desirable attributes. Without limiting the scope of the $\delta$-$Bi_2O_3$ composition and related methods and articles/devices as defined by the claims that follow, their more prominent features will now be discussed briefly. After considering this discussion, and particularly after reading the section of this specification entitled "Detailed Description of the Invention," one will understand how the features of the various embodiments disclosed herein provide a number of advantages over the current state of the art. These advantages may include, without limitation, providing $Bi_2O_3$ composition embodiments having enhanced conductivity at lower temperatures than $Bi_2O_3$ compositions known to date, providing $\delta$-$Bi_2O_3$ composition embodiments that are room temperature stable without the need for dopants, substrates, or other stabilizing components, providing SOM materials that offer desirable conductively across a wider array of temperatures than previously possible, allowing access to otherwise inaccessible material properties, and/or enabling novel devices including oxygen sensors and low temperature SOFCs.

In a first aspect, the invention provides an ion conductive (i.e., on oxygen ion conductive) composition comprising $\delta$-phase $Bi_2O_3$, wherein the composition comprises at least 95 wt % $Bi_2O_3$ and, at 25° C., the composition is stable and has a conductivity of at least $10^{-7}$ S/cm.

In a second aspect, the invention provides a film comprising the inventive composition according to the first aspect of the invention.

In a third aspect, the invention provides an apparatus or device (e.g., an electrochemical device) comprising the composition according to the first aspect of the invention or the film according to the second aspect of the invention.

In a fourth aspect, the invention provides a method of making the composition according to the first aspect of the invention, said method comprising heating $Bi_2O_3$ to at least 730° C., then cooling the material to less than or equal to 400° C., wherein, during said cooling, the temperature of the material is reduced from 650° C. to less than or equal to 400° C. within 100 ms or less, thereby obtaining $\delta$-phase $Bi_2O_3$.

These and other objects, features, and advantages of this invention will become apparent from the following detailed description of the various aspects of the invention taken in conjunction with the accompanying drawings.

BRIEF DESCRIPTION OF THE DRAWINGS

The present invention will hereinafter be described in conjunction with the following drawing figures. The depicted figures serve to illustrate various embodiments of the invention. However, the invention is not limited to the precise arrangements and instrumentalities of the embodiments in the drawings.

FIGS. 16A-B depict (16A) conductivities extracted from fits of impedance data during thermal ramp up to 250° C. and cooling down to 100° C. While the sample was heated to 250° C., the highest point for which the conductivity could be measured was 220° C. (16B) Temperature-time profile experienced by the sample during annealing. The data follow the same trend before and after annealing, showing that conductivity remains stable with thermal cycling.

DETAILED DESCRIPTION OF THE INVENTION

Figure 1:
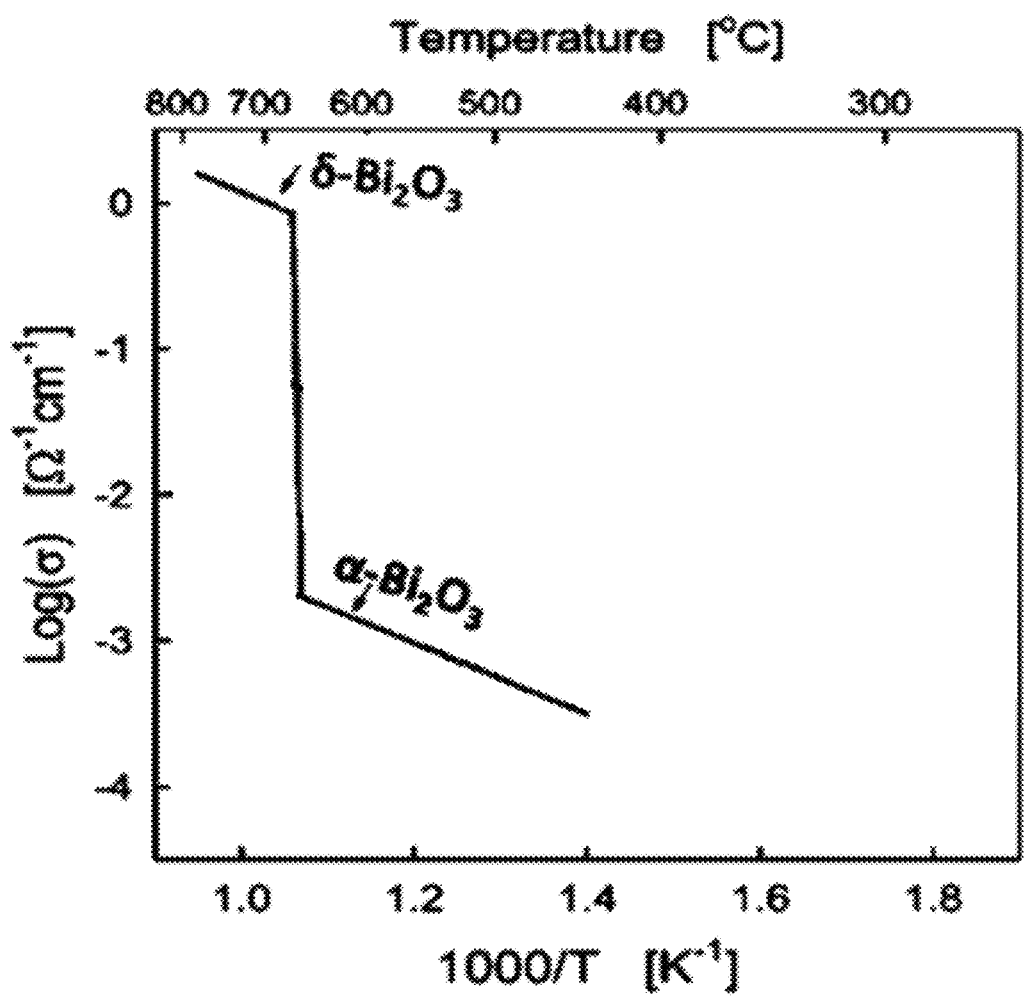
FIG. 1 is a chart showing the rapid conversion of $\delta$-$Bi_2O_3$ to $\alpha$-$Bi_2O_3$ and the concurrent oxygen ion conductivity plummet as temperature drops below 700° C.

The present invention relates to, inter alia, $\delta$-phase bismuth oxide ($Bi_2O_3$) that is stable at room temperature (25° C.), as well as to related methods and devices.

Aspects of the present invention and certain features, advantages, and details thereof are explained more fully below with reference to the non-limiting embodiments discussed and illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and not by way of limitation. Various substitutions, modifications, additions and/or arrangements within the spirit and/or scope of the underlying inventive concepts will be apparent to those skilled in the art from this disclosure.

In a first aspect, the invention provides an ion conductive composition comprising $\delta$-phase $Bi_2O_3$, wherein the composition comprises at least 95 wt % $Bi_2O_3$ and, at 25° C., the composition is stable and has a conductivity of at least $10^{-7}$ S/cm.

As used herein, the term "$\delta$-phase $Bi_2O_3$" (which may be used interchangeably with "delta-phase $Bi_2O_3$", "$\delta$-$Bi_2O_3$", and "delta-$Bi_2O_3$"), refers to an oxygen ion conductor face-centered cubic (fcc) crystallographic polymorph of $Bi_2O_3$, wherein bismuth occupies the face center sites. Unless otherwise specified, the oxygen sublattice in the $\delta$-phase $Bi_2O_3$ may be ordered or unordered.

In some embodiments, the oxygen sublattice in the $\delta$-phase $Bi_2O_3$ is unordered, whereas, in other embodiments, the oxygen sublattice in the $\delta$-phase $Bi_2O_3$ is ordered.

While certain prior known $Bi_2O_3$ compositions require dopants in order to achieve enhanced stability, embodiments of the present invention are stable even in the absence of dopant(s). Thus, while inventive embodiments may optionally comprise a dopant, in other embodiments, the composition is not doped (i.e., it does not comprise a dopant material).

In some embodiments, the inventive composition does not comprise cadmium (Cd), calcium (Ca), cerium (Ce), chromium (Cr), copper (Cu), erbium (Er), gallium (Ga), hafnium (Hf), indium (In), lanthanum (La), lead (Pb), lithium (Li), magnesium (Mg), manganese (Mn), molybdenum (Mo), niobium (Nb), rhenium (Re), tin (Sn), titanium (Ti), tungsten (W), yttrium (Y), zinc (Zn), and/or zirconium (Zr).

In some embodiments, the inventive composition does not comprise an alkaline earth metal (beryllium (Be), magnesium (Mg), calcium (Ca), strontium (Sr), barium (Ba), and/or radium (Ra)).

In some embodiments, the inventive composition does not comprise a rare earth element (e.g., praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and/or lutetium (Lu)).

Embodiments of the inventive composition contain 95 to 100 weight percent (wt %) of the compound δ-phase $Bi_2O_3$ (e.g., 95.0, 95.1, 95.2, 95.3, 95.4, 95.5, 95.6, 95.7, 95.8, 95.9, 96.0, 96.1, 96.2, 96.3, 96.4, 96.5, 96.6, 96.7, 96.8, 96.9, 97.0, 97.1, 97.2, 97.3, 97.4, 97.5, 97.6, 97.7, 97.8, 97.9, 98.0, 98.1, 98.2, 98.3, 98.4, 98.5, 98.6, 98.7, 98.8, 98.9, 99.0, 99.1, 99.2, 99.3, 99.4, 99.5, 99.6, 99.7, 99.8, 99.9, or 100.0 wt % δ-phase $Bi_2O_3$), including any and all ranges and subranges therein (e.g., 96 to 100 wt %, 97 to 100 wt %, 98 to 100 wt %, 99 to 100 wt %, 99.5 to 100 wt %, 99.9 to 100 wt %, etc.). In some embodiments, the inventive composition contains at least 95, 95.1, 95.2, 95.3, 95.4, 95.5, 95.6, 95.7, 95.8, 95.9, 96.0, 96.1, 96.2, 96.3, 96.4, 96.5, 96.6, 96.7, 96.8, 96.9, 97.0, 97.1, 97.2, 97.3, 97.4, 97.5, 97.6, 97.7, 97.8, 97.9, 98.0, 98.1, 98.2, 98.3, 98.4, 98.5, 98.6, 98.7, 98.8, 98.9, 99.0, 99.1, 99.2, 99.3, 99.4, 99.5, 99.6, 99.7, 99.8, 99.9, 99.91, 99.92, 99.93, 99.94, or 99.95 wt % δ-phase $Bi_2O_3$. In some embodiments, the composition is 100 wt % δ-phase $Bi_2O_3$.

In some embodiments, the composition comprises greater than 95 mole % of the δ-phase $Bi_2O_3$ (e.g., greater than 95.1, 95.2, 95.3, 95.4, 95.5, 95.6, 95.7, 95.8, 95.9, 96.0, 96.1, 96.2, 96.3, 96.4, 96.5, 96.6, 96.7, 96.8, 96.9, 97.0, 97.1, 97.2, 97.3, 97.4, 97.5, 97.6, 97.7, 97.8, 97.9, 98.0, 98.1, 98.2, 98.3, 98.4, 98.5, 98.6, 98.7, 98.8, 98.9, 99.0, 99.1, 99.2, 99.3, 99.4, 99.5, 99.6, 99.7, 99.8, 99.9, 99.91, 99.92, 99.93, 99.94, or 99.95 mole % δ-phase $Bi_2O_3$).

In some embodiments, the inventive composition contain 95 to 100 atomic percent (at %) of the compound δ-phase $Bi_2O_3$ (e.g., 95.0, 95.1, 95.2, 95.3, 95.4, 95.5, 95.6, 95.7, 95.8, 95.9, 96.0, 96.1, 96.2, 96.3, 96.4, 96.5, 96.6, 96.7, 96.8, 96.9, 97.0, 97.1, 97.2, 97.3, 97.4, 97.5, 97.6, 97.7, 97.8, 97.9, 98.0, 98.1, 98.2, 98.3, 98.4, 98.5, 98.6, 98.7, 98.8, 98.9, 99.0, 99.1, 99.2, 99.3, 99.4, 99.5, 99.6, 99.7, 99.8, 99.9, or 100.0 at % δ-phase $Bi_2O_3$), including any and all ranges and subranges therein (e.g., 96 to 100 at %, 97 to 100 at %, 98 to 100 at %, 99 to 100 at %, 99.5 to 100 at %, 99.9 to 100 at %, etc.). In some embodiments, the inventive composition contains at least 95, 95.1, 95.2, 95.3, 95.4, 95.5, 95.6, 95.7, 95.8, 95.9, 96.0, 96.1, 96.2, 96.3, 96.4, 96.5, 96.6, 96.7, 96.8, 96.9, 97.0, 97.1, 97.2, 97.3, 97.4, 97.5, 97.6, 97.7, 97.8, 97.9, 98.0, 98.1, 98.2, 98.3, 98.4, 98.5, 98.6, 98.7, 98.8, 98.9, 99.0, 99.1, 99.2, 99.3, 99.4, 99.5, 99.6, 99.7, 99.8, 99.9, 99.91, 99.92, 99.93, 99.94, or 99.95 at % δ-phase $Bi_2O_3$. In some embodiments, the composition is 100 at % δ-phase $Bi_2O_3$.

Embodiments of the inventive composition are stable at room temperature, meaning that, at 25° C. (and normal atmospheric pressure), the δ-phase $Bi_2O_3$ remains stable and does not transform to one or more additional phases over a time period of, unless otherwise specified, 24 hours.

In some embodiments, the composition is substantially single phase, or "phase pure", meaning that the only $Bi_2O_3$ present is in the delta phase. For example, in some embodiments, the composition comprises less than 1 vol % or less than 1 wt % of any secondary (non-δ-phase) $Bi_2O_3$ phases.

In some embodiments, the inventive composition is stable at 25° C. for at least 24 hours, or at least 30 days, 60 days, 90 days, 180 days, 1 year, 1.5 years, or 2 years.

At 25° C., embodiments of the inventive composition have a conductivity of at least $10^{-7}$ S/cm. In some embodiments, at 25° C., the composition has a conductivity of $10^{-7}$ to $10^{-3}$ S/cm, including any and all ranges and subranges therein (e.g., $10^{-6}$ to $10^{-3}$ S/cm, $10^{-5}$ to $10^{-3}$ S/cm, or $10^{-4}$ to $10^{-3}$ S/cm). In some embodiments, at 25° C., the composition has a conductivity of at least $10^{-7}$ S/cm, $10^{-6.5}$ S/cm, $10^{-6}$ S/cm, $10^{-5.9}$ S/cm, $10^{-5.8}$ S/cm, $10^{-5.7}$ S/cm, $10^{-5.6}$ S/cm, $10^{-5.5}$ S/cm, $10^{-5.4}$ S/cm, $10^{-53}$ S/cm, $10^{-5.2}$ S/cm, $10^{-5.1}$ S/cm, $10^{-5}$ S/cm, $10^{-4.9}$ S/cm, $10^{-4.8}$ S/cm, $10^{-4.7}$ S/cm, $10^{-4.6}$ S/cm, or $10^{-4.5}$ S/cm.

While various prior known δ-phase $Bi_2O_3$ compositions suffer from defects (e.g., pinholes, such as those formed by magnetron sputtering), embodiments of the present invention are 99 to 100 volume percent (vol %) defect (e.g., pinhole) free. In some embodiments, the inventive composition is at least 99.0, 99.1, 99.2, 99.3, 99.4, 99.5, 99.6, 99.7, 99.8, or 99.9 vol % defect (e.g., pinhole) free. In some embodiments, the composition is 100 vol % pinhole free.

In some embodiments the inventive composition has a grain size of 4 nm to 1 m, including any and all ranges and subranges therein (e.g., 5 nm to 500 mm, 5 nm to 100 mm, 6 nm to 10 mm, etc.). In some embodiments the inventive composition has a grain size of 4 nm to 1,000,000 nm (e.g., 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 384, 385, 386, 387, 388, 389, 390, 391, 392, 393, 394, 395, 396, 397, 398, 399, 400, 401, 402, 403, 404, 405, 406, 407, 408, 409, 410, 411, 412, 413, 414, 415, 416, 417, 418, 419, 420, 421, 422, 423, 424, 425, 426, 427, 428, 429, 430, 431, 432, 433, 434, 435, 436, 437, 438, 439, 440, 441, 442, 443, 444, 445, 446, 447, 448, 449, 450, 451, 452, 453, 454, 455, 456, 457, 458, 459, 460, 461, 462, 463, 464, 465, 466, 467, 468, 469, 470, 471, 472, 473, 474, 475, 476, 477, 478, 479, 480, 481, 482, 483, 484, 485, 486, 487, 488, 489, 490, 491, 492, 493, 494, 495, 496, 497, 498, 499, 500, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, 50000, 51000, 52000, 53000, 54000, 55000, 56000, 57000, 58000, 59000, 60000, 61000, 62000, 63000, 64000, 65000, 66000, 67000, 68000, 69000, 70000, 71000, 72000, 73000, 74000, 75000, 76000, 77000, 78000, 79000, 80000, 81000, 82000, 83000, 84000, 85000, 86000, 87000, 88000, 89000, 90000, 91000, 92000, 93000, 94000, 95000, 96000, 97000, 98000, 99000, 100000, 200000, 300000, 400000, 500000, 600000, 700000, 800000, 900000, or 1000000 nm), including any and all ranges and subranges therein.

In a second aspect, the invention provides a film comprising the inventive composition according to the first aspect of the invention.

In some embodiments, the film can be employed as a membrane. For example, in some embodiments, the film is a SOM that can be employed in an article/device such as an electrochemical cell, SOFC, oxygen sensor, or metal-air battery.

In some embodiments, the film is monolithic, continuous material (vs., e.g., a particulate composition).

In some embodiments, the film has a thickness of 10 nm to 10,000 nm (e.g., 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 384, 385, 386, 387, 388, 389, 390, 391, 392, 393, 394, 395, 396, 397, 398, 399, 400, 401, 402, 403, 404, 405, 406, 407, 408, 409, 410, 411, 412, 413, 414, 415, 416, 417, 418, 419, 420, 421, 422, 423, 424, 425, 426, 427, 428, 429, 430, 431, 432, 433, 434, 435, 436, 437, 438, 439, 440, 441, 442, 443, 444, 445, 446, 447, 448, 449, 450, 451, 452, 453, 454, 455, 456, 457, 458, 459, 460, 461, 462, 463, 464, 465, 466, 467, 468, 469, 470, 471, 472, 473, 474, 475, 476, 477, 478, 479, 480, 481, 482, 483, 484, 485, 486, 487, 488, 489, 490, 491, 492, 493, 494, 495, 496, 497, 498, 499, 500, 1000, 2000, 3000, 4000, 5000, 6000, 7000, 8000, 9000, or 10000 nm), including any and all ranges and subranges therein.

In a third aspect, the invention provides an apparatus or device (e.g., an electrochemical device) comprising the composition according to the first aspect of the invention or the film according to the second aspect of the invention.

In some embodiments, the device is selected from a solid oxide fuel cell (SOFC), oxygen sensor, and metal-air battery.

In some embodiments, the device is an electrochemical device that comprises an anodic layer, an electrolytic layer, and a cathodic layer, wherein the electrolytic layer is disposed between the anodic layer and the cathodic layer, and wherein the electrolytic layer comprises the composition according to the first aspect of the invention or the film according to the second aspect of the invention.

In some embodiments, the device is operable (i.e., it operates) at temperatures of about 25 to 400° C. (e.g., 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 384, 385, 386, 387, 388, 389, 390, 391, 392, 393, 394, 395, 396, 397, 398, 399, or 400° C.), including any and all ranges and subranges therein.

In a fourth aspect, the invention provides a method of making the composition according to the first aspect of the invention, said method comprising heating $Bi_2O_3$ to at least 730° C., then cooling the material to less than or equal to 400° C., wherein, during said cooling, the temperature of the material is reduced from 650° C. to less than or equal to 400° C. within 100 ms or less, thereby obtaining δ-phase $Bi_2O_3$.

Applicant has found that, where rapid cooling (within 100 ms or less) is performed at least during cool down within the range from 650° C. to 400° C., δ-phase $Bi_2O_3$ having favorable conductivity is obtained.

In some embodiments, the method comprises heating $Bi_2O_3$ to at least 730, 740, 750, 760, 770, 780, 790, 800, 810, 820, 830, 840, 850, 860, 870, 880, 890, or 900° C., or any temperature intermediary thereto, prior to said cooling.

In some embodiments, the method comprises heating the $Bi_2O_3$ above 830° C.

In some embodiments, the method comprises, after said heating, cooling the $Bi_2O_3$ from 730° C. or more (e.g., from 750, 760, 770, 780, 790, 800, 810, 820, 830, 840, 850, 860, 870, 880, 890, or 900° C.) to less than or equal to 400° C. (e.g., to 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 384, 385, 386, 387, 388, 389, 390, 391, 392, 393, 394, 395, 396, 397, 398, 399, or 400° C.) within 100 ms or less (e.g., within 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 ms or less).

In some embodiments, the method comprises cooling the material to less than or equal to 250° C.

In some embodiments, the method comprises cooling the material to a desired temperature (e.g., less than or equal to 400° C. or less than or equal to 250° C.) within 50 ms or less (or within, e.g., 40, 30, 20, 10, or 5 ms or less).

In some embodiments, laser spike annealing (LSA) is used during the said heating $Bi_2O_3$.

EXAMPLES

The invention will now be illustrated, but not limited, by reference to the specific embodiments described in the following examples.

The non-limiting embodiments discussed herein demonstrate quenching of δ-$Bi_2O_3$ to room temperature using X-ray probed laser anneal mapping (XPLAM), a high throughput technique coupling spatially resolved X-ray diffraction with microsecond to millisecond laser anneals. The resulting films exhibit room temperature conductivities several orders of magnitude higher than best-in-class materials, with temperature dependence that suggests conduction of oxygen through ordered vacancies and stability for at least 8 h at temperatures above 150° C. The XPLAM phase mapping technique and OIC material described here hold substantial fundamental as well as technological promise.

Reported herein is the nucleation at high temperature, and quenching to room temperature, of δ-$Bi_2O_3$ using lateral gradient laser spike annealing (lgLSA); lgLSA accesses heating and quenching rates up to $10^{7}$° C. $s^{-1}$, orders of magnitude faster than conventional techniques, by limiting annealing durations to micro- to milliseconds. The unique capabilities of laser annealing have been applied for decades in the semiconductor industry to activate dopants and have recently found wider adoption controlling phase changes and nanoconfined crystal growth. The Applicant took advantage of the capabilities of laser annealing with its development of the X-ray probed laser anneal mapping (XPLAM) technique, which combines the annealing gradients created by lgLSA (FIG. 3) with spatially resolved synchrotron X-ray diffraction to enable the systematic high-throughput exploration of phase behavior as a function of annealing conditions. The resultant phases in the $Bi_2O_3$ system were mapped for annealing temperatures between room temperature and 900° C. (above the 830° C. equilibrium melting point) and dwell times between 0.15-10 ms (peak quench rates between $10^4$ and $10^{6}$° C. $s^{-1}$, FIGS. 4 and 5), a regime well beyond that previously explored for $Bi_2O_3$ by any other method. By starting with amorphous $Bi_2O_3$ (FIG. 8) with a high free energy, the driving force for nucleating an initial crystalline phase is much larger than the driving force for subsequent crystal-crystal transformations, allowing the limited kinetics of a short anneal to capture even the first nucleated phases. At temperatures that exceed the melting point, these anneals erase any as-deposited film defects (FIG. 6), resulting in pinhole-free films. Fabrication of devices based on δ-$Bi_2O_3$ requires such pinhole-free films, and the creation of this quality of film with melt-processing provides a great deal of flexibility for post-processing, regardless of the deposition method.

Phase Mapping Formation. XPLAM (FIG. 11A) was used to map phase development across samples. Spatial maps (FIG. 11B) of diffraction patterns for dwells of 0.25, 2, and 10 ms show the transition from amorphous at low peak temperatures (edges) to crystalline at higher temperatures (centers). Peak-splitting at 2, 2.3, and 3.8 $Å^{-1}$ indicates formation of multiple phases as a function of peak temperature and dwell. For 2 ms and 10 ms anneals, damage is observed at the highest peak temperatures. Characteristic diffraction patterns for α, β, and δ (designated as $δ_S$ when formed from the solid phase and $δ_L$ when formed from the melt) are given in FIG. 11C, where peak markings correspond to ICSD entries for the phases, including compensation for peak shift likely induced by lattice strain. The contribution of each phase to the measured diffraction was identified as a function of position (FIG. 11D) and peak temperature (FIG. 11E).

Figure 12:
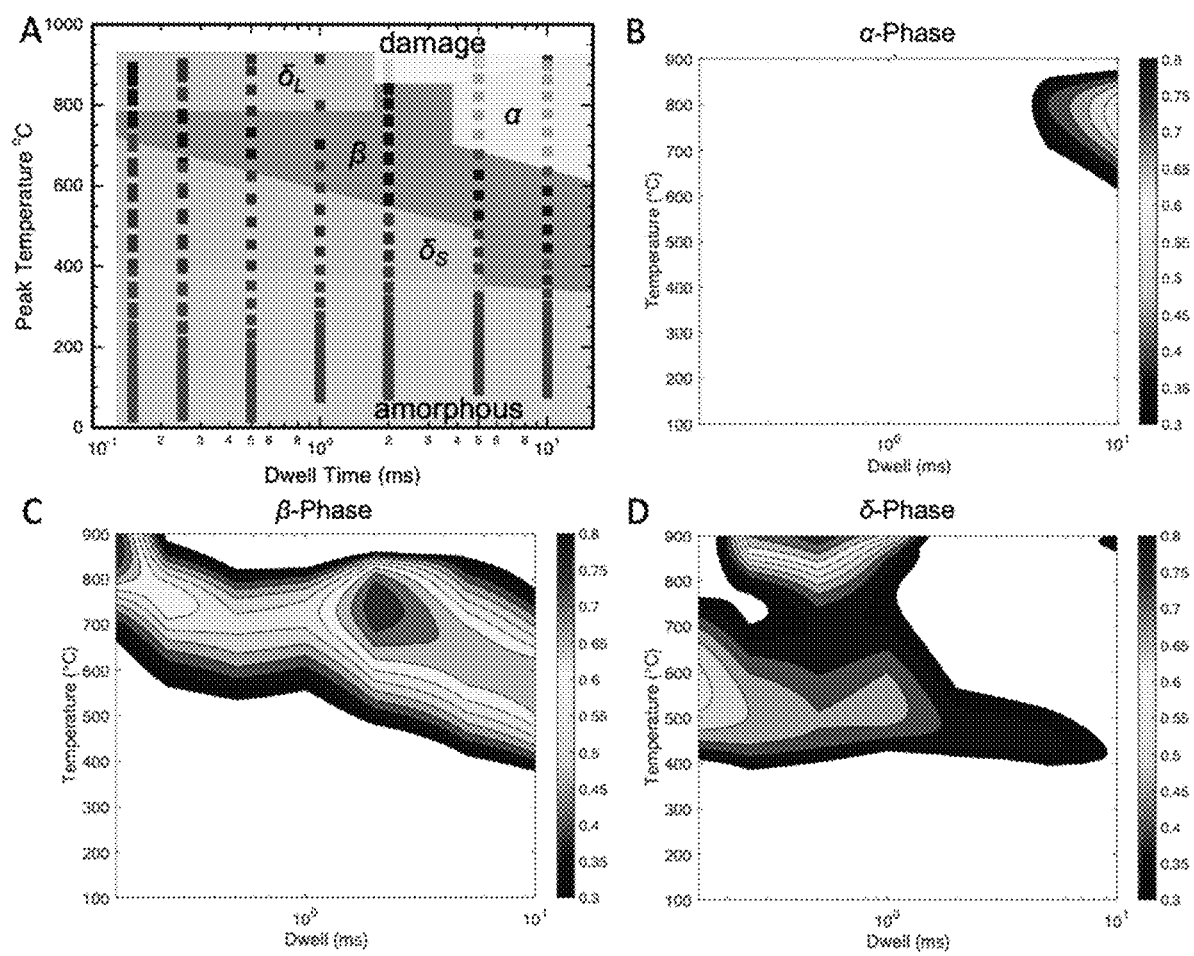
FIGS. 12A-D show peak annealing temperature and dwell time maps of $Bi_2O_3$ phases. (12A) Temperature-dwell-transformation (TDT) diagram displaying the predominant room temperature phase as a function of dwell time and peak temperature. Each square is a measured condition and colored regions indicate the approximate processing regimes expected to result in each phase. (12B-D) Weighted phase fractions of room temperature stable $\alpha$-phase (12B), $\beta$-phase (12C), and $\delta$-phase (12D).

By identifying the dominant phase for each peak temperature at seven dwells between 0.15 and 10 ms, a temperature-dwell-transformation (TDT) diagram was constructed (FIG. 12A). Processing regimes resulting in the same dominant phase are identified. The film remains amorphous for temperatures below 350-400° C. for all dwells investigated. Above these temperatures, the fractional intensity of each phase was mapped (FIG. 12B-D). Two phase-pure δ-phase forming regimes are identified, one via a solid-state transformation ($\delta_S$) in a shrinking temperature window ranging from just above the amorphous transition to 750° C. at 150 µs and 500° C. at ≤5 ms, and the other via a melt mediated transformation ($\delta_L$) for temperatures above 750° C. and dwells below 2 ms. A β-rich region is found between high and low temperature δ-phase regions and extends to 10 ms, and an α-rich region appears at the longest dwells and highest temperatures.

Figure 6:
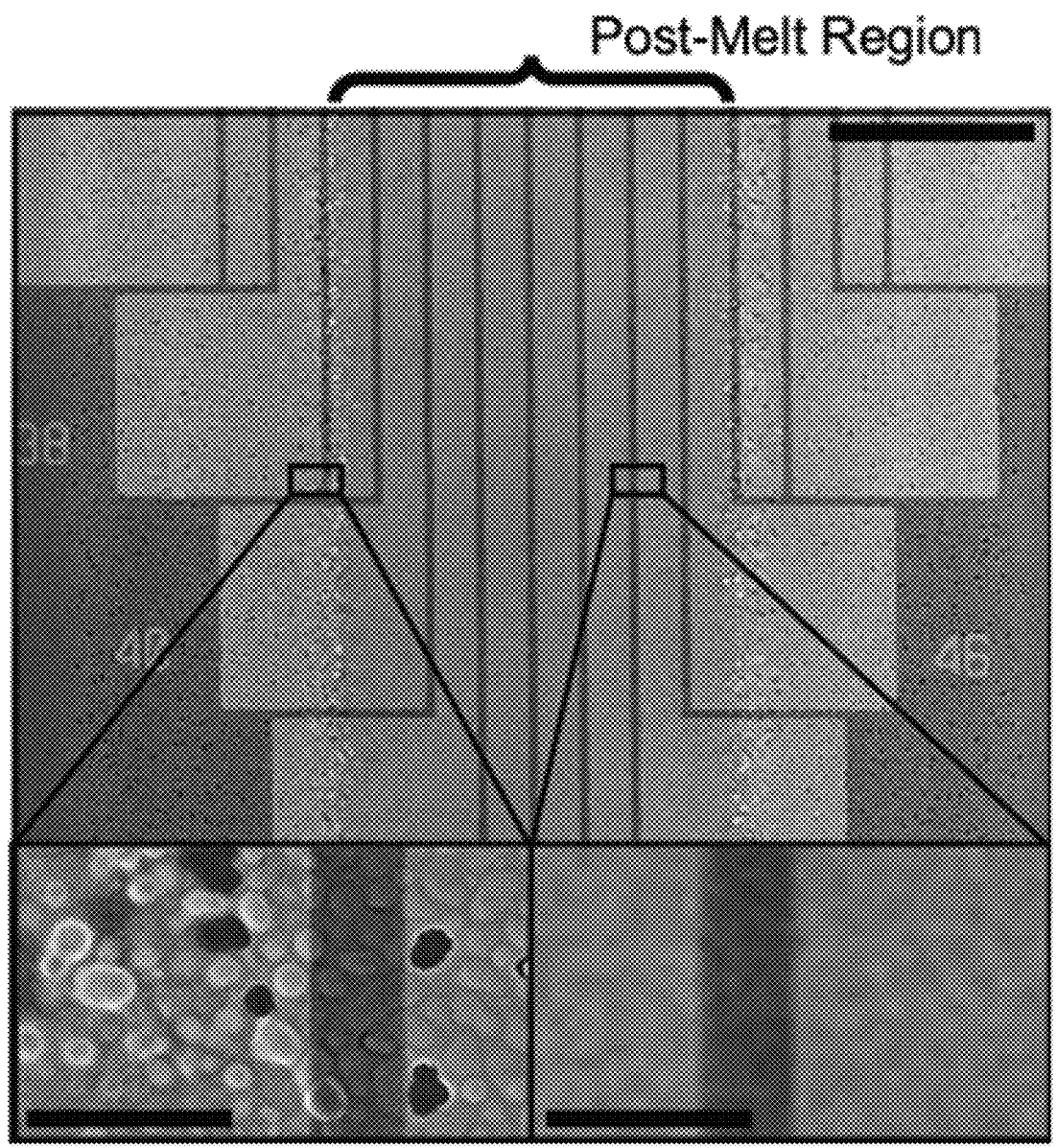
FIG. 6 is an SEM of electric contacts patterned on top of 1 ms dwell annealed $Bi_2O_3$ film showing the pinhole-free post-melt region in the center bounded by regions with peak temperature below the melt on either side of the center (scalebar 100 μm). Insets are magnified views of both post-melt and sub-melt regions (scalebars 10 μm).
Figure 11:
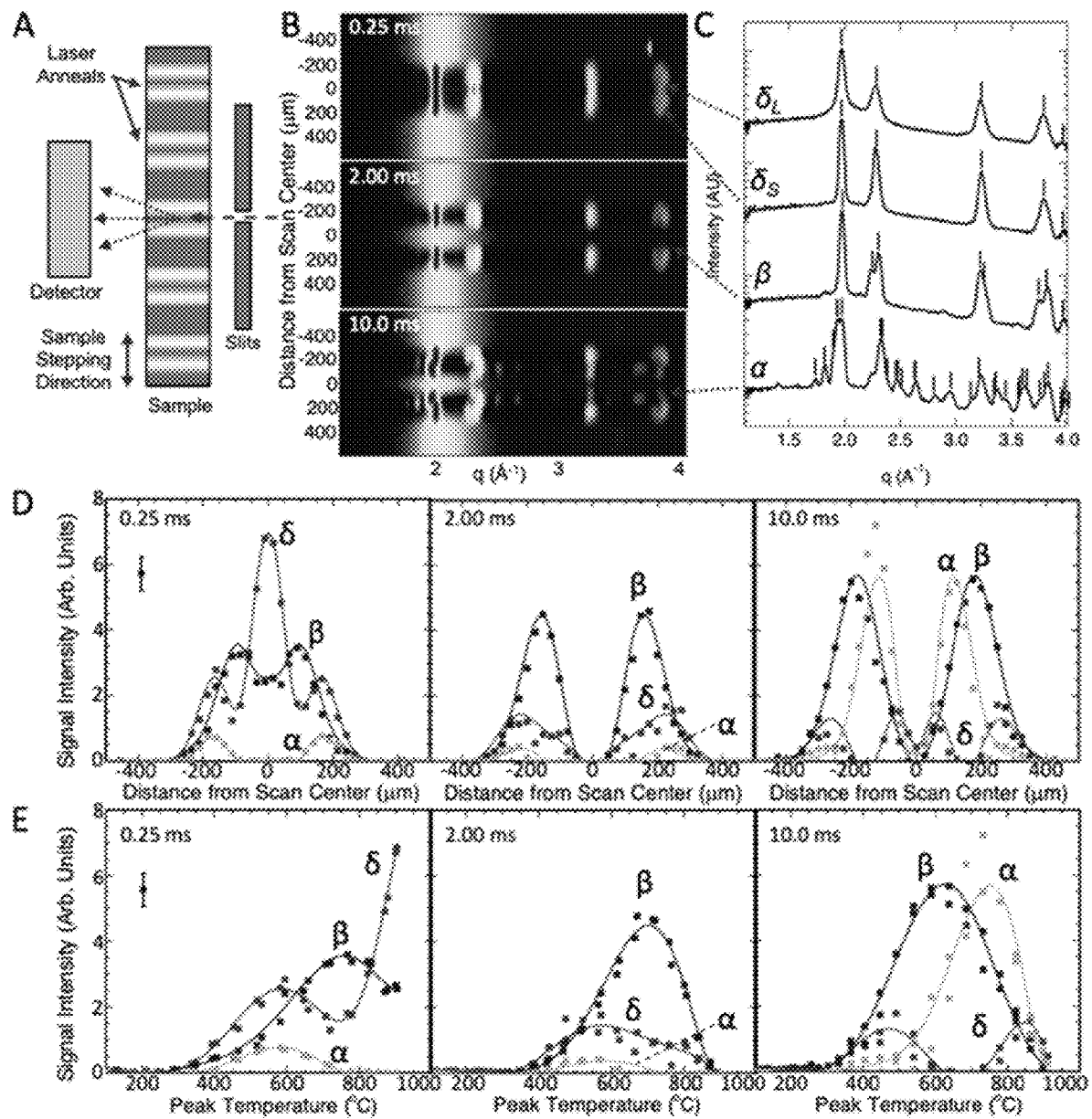
FIGS. 11A-E depict mapping spatial and temperature dependent phase formation for different annealing dwell times. (11A) Schematic of XPLAM method, showing X-ray micro-beam mapping of laser annealed sample. The incident X-ray beam (dashed, 25 μm wide after slits) is parallel to the laser annealed regions. Diffraction patterns are taken across varying peak temperature and dwell conditions as the sample is stepped. (11B) Heat maps of diffraction intensity, I(q), as a function of spatial location across lgLSA scans for dwells of 0.25, 2.00, and 10.0 ms with 900° C. peak temperatures in the scan centers. (11C) Diffraction patterns for resultant $\delta$ (cubic; nucleated by liquid→solid, $\delta_L$, and solid→solid, $\delta_S$, transformations), $\beta$ (tetragonal), and $\alpha$ (monoclinic) phases with arrows marking their location in (11B). (11D) Relative diffraction intensities for $\delta$, $\beta$, and $\alpha$ phases across each lgLSA scan in (11B). A typical least-squares fitting error bar is shown in the 0.25 ms figure. Solid lines are symmetric fits. (11E) Intensities from (11D) converted from location to calibrated peak temperature.

It is believed the low temperature $\delta_S$ regime is the result of a direct amorphous to δ transformation, as evidenced by a remnant amorphous $Bi_2O_3$ fraction that appears as a broad peak near 2 Å$^{-1}$ for $\delta_S$ shown in FIG. 11C. Additionally, the lower bound of the high temperature $\delta_L$-region is likely depressed from the 830° C. equilibrium melting point (to the observed 750° C.) as a result of the starting metastable amorphous state. In this $\delta_L$-region, a combination of faster liquid kinetics and nucleation-limited growth (grain growth much faster than nucleation) results in no remnant amorphous fraction, high phase purity, and large domains (>100 nm by Scherrer analysis). This $\delta_L$-region also exhibits the post-melt erasure of as-deposited film defects as shown in FIG. 6. Interestingly, while the two-dimensional diffraction patterns for α, β, and $\delta_S$ exhibit very little anisotropy, the $\delta_L$ region exhibited spots consistent with textured crystal growth (not pictured).

These data suggest that the δ-phase is the kinetically preferred phase to initially nucleate under all conditions explored, with the observed β and α-phases forming as a result of a subsequent amorphous→δ→β→α transformation pathway. The presence of an amorphous signal in short dwell $\delta_S$ strongly suggests that δ-phase nucleates first in solid state transformations. The β rich region between $\delta_S$ and $\delta_L$ largely overlaps the temperature region where δ is the equilibrium phase, and where thermodynamics would favor δ nucleation. While direct β-phase nucleation is impossible to rule out with these ex-situ measurements, it is believed that the β-rich region results from an amorphous→δ→β transformation pathway, mimicking the rapid transformation of δ→β at 650° C. widely reported in furnace quenches. This is supported by the direct exchange of the δ- and β-phase fraction at higher temperatures and dwell times (FIG. 12C, D). In fact, the continued presence of δ to longer dwells at lower temperatures suggests that the δ→β nucleation rate maximum occurs between 550° C. and 650° C. The presence of a local maximum in β-composition at the shortest dwells and highest temperatures is not fully explained by this model, suggesting that another factor may influence nucleation under the most extreme conditions. The lack of the very distinct a signal until long times and high temperatures suggests that, despite being the stable phase at temperatures below 730° C., α does not directly nucleate from the amorphous and is instead produced by an amorphous→δ→β→α transformation pathway. This mirrors the transformation pathway during furnace quenching from high temperature stable δ-phase of δ→β→α. The disappearance of both δ regimes by 10 ms dwells, with quench still near $10^{4o}$ C. s$^{-1}$, explains why the quench of the δ-phase has not been previously accomplished by studies using much lower quench rates.

The δ-phase is preserved in melt processed films for dwells up to 1 ms, despite nucleation of β at sub-melt temperatures for dwells as short as 0.15 ms. These results suggest that melt processing substantially lowers the concentration of defects in the $Bi_2O_3$ film, reducing the number of heterogeneous nucleation sites and subsequently depresses β→β nucleation rates compared to solid state processing. This also suggests that melt produced δ-films may have increased low-temperature stability compared to δ-films produced by other methods.

Ionic Conductivity Measurements.

Figure 7:
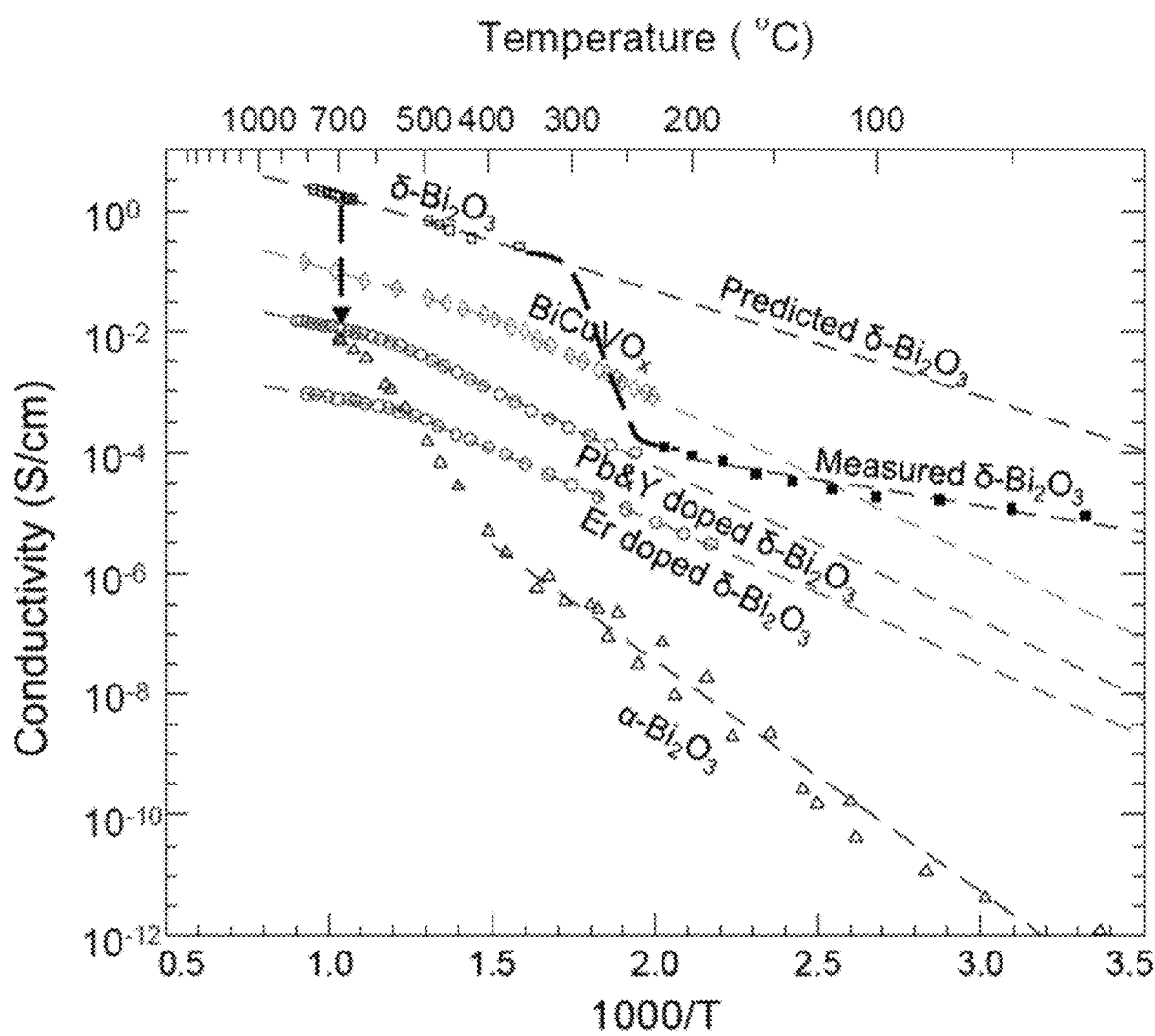
FIG. 7 shows conductivities for an inventive $\delta$-$Bi_2O_3$ embodiment (shown in black squares), as well as for previously measured (by others) $\delta$-$Bi_2O_3$, $\alpha$-$Bi_2O_3$, and other compositions.
Figure 14:
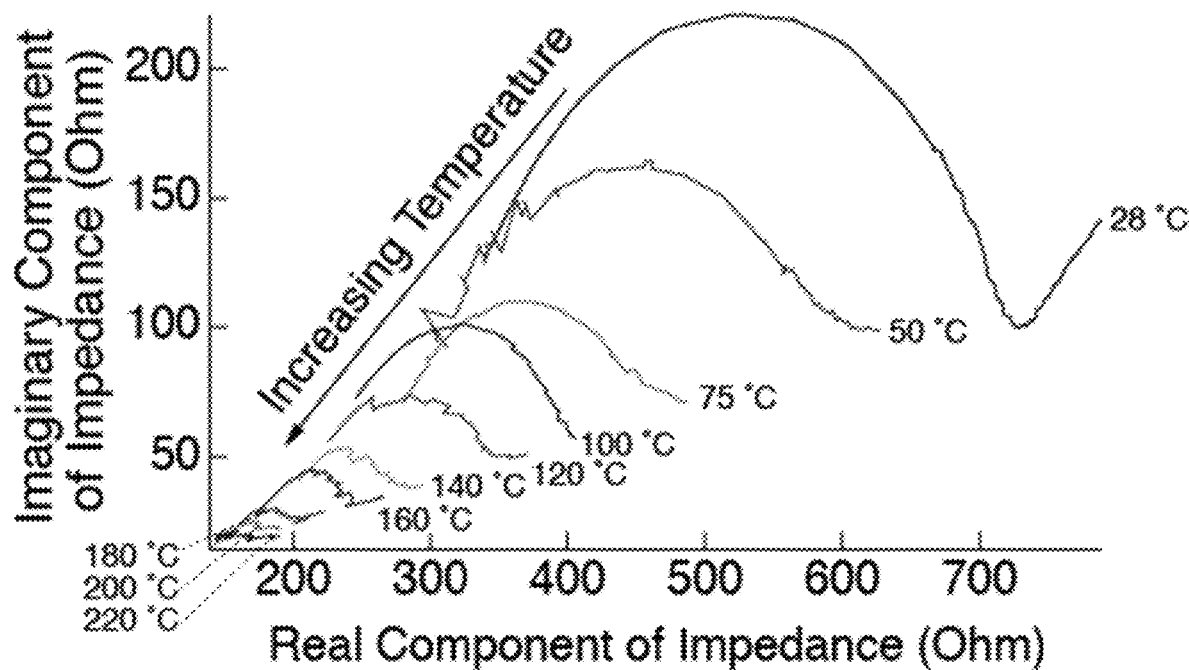
FIG. 14 is a graph showing real vs. imaginary impedance of a device shown in FIG. 2A for a range of temperatures from room temperature to 220° C.
Figure 15:
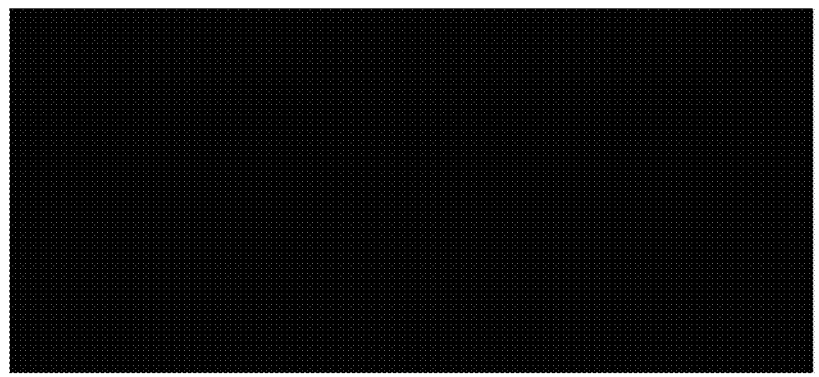
FIG. 15 is a circuit diagram used to model the impedance spectroscopy of embodiments of $\delta$-$Bi_2O_3$ devices.
Figure 17A:
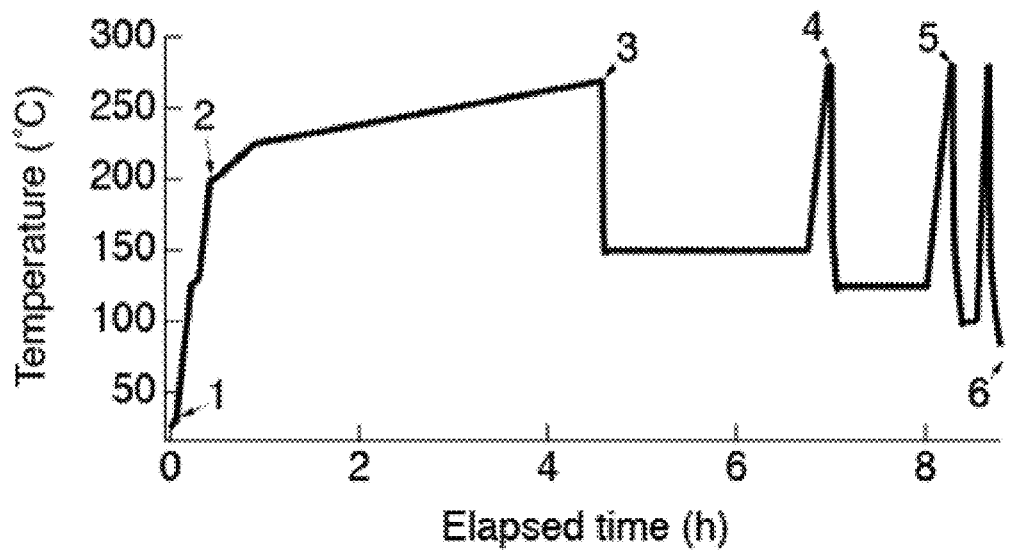
FIGS. 17A-B depict in-situ X-ray diffraction measurements of laser-quenched $\delta$-$Bi_2O_3$ during thermal cycling for over 8 h (17A) at temperatures up to 280° C. The material retains peaks consistent with the $\delta$ phase and does not exhibit any other peaks for the duration of the cycle (17B), indicating that despite the material's metastable nature it is fully stable under typical device operation conditions.
Figure 17B:
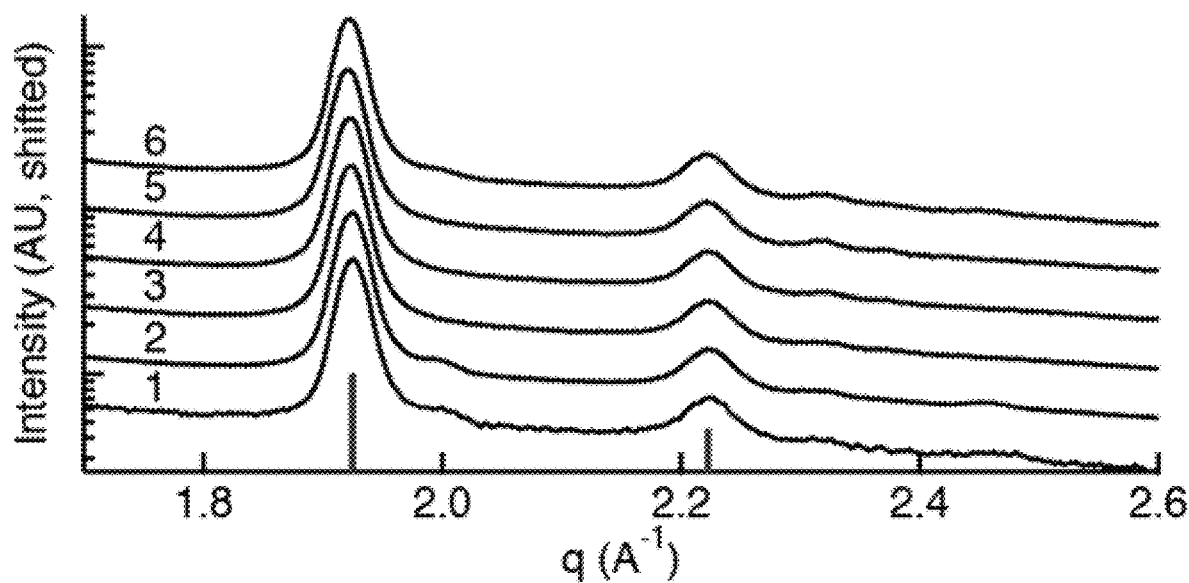

Annealing conditions of 850° C. with 0.25 ms dwell were chosen to create phase-pure, large domain, pinhole free δ-$Bi_2O_3$ devices (FIG. 2A, FIG. 9) that enabled measurement of the low temperature ion conductivity. Impedance spectroscopy was used to measure real and imaginary impedances as a function of temperature for the δ-$Bi_2O_3$ devices (FIG. 14, FIG. 15). The conductivity of the 140-180 nm thick δ-$Bi_2O_3$ layer was deconvoluted from the other device layers; values vary between 10$^{-4}$ and 10$^{-5}$ cm$^{-1}$ between 220 and 25° C. (FIG. 7 and FIG. 16A). Prior to this work, the lowest temperature for which δ-$Bi_2O_3$ conductivities were reported was 350° C. (Laurent et al., Structure and Conductivity Studies of Electrodeposited δ-$Bi_2O_3$, *Solid State Ionics* 2008, 178 (33-34), 1735-1739). At the lowest temperature measured, 25° C., the conductivity is over 6 orders of magnitude higher than for the low-temperature stable α-phase (10$^{-5.05\pm0.03}$ S cm$^{-1}$ for δ vs 10$^{-11.9}$ S cm$^{-1}$ for α). To probe the stability of δ-$Bi_2O_3$ devices at high temperature, a combination of cycled ionic conductivity measurements (FIG. 16) and in-situ synchrotron X-ray diffraction during heating were performed (FIGS. 17A,B). During thermal cycling up to 220° C. over a two-hour period, the conductivity remained stable (FIG. 16B). This reproducibility further suggests that the ionic transport is also stable and does not undergo substantial irreversible changes on these timescales and temperatures. These results were corroborated by separate in-situ X-ray experiments during thermal sample cycling at temperatures between 150° C. and 280° C. for over 8 h (FIG. 17A,B), showing no changes in the diffraction pattern and indicating stability to these higher temperatures and times. It is further noted that no phase degradation has been observed for samples stored under ambient conditions (18-35° C., 20-80% relative humidity) for over a year.

From the temperature dependence of the measured conductivities, the activation energy of oxygen transport in this low temperature δ-$Bi_2O_3$ is 0.24 eV, differing from high temperature activation energies of 0.35 eV. In addition, the measured conductivity values, while high, are lower than an extrapolation from the high temperature behavior (FIG. 7). It has been hypothesized that the oxygen in low temperature δ-$Bi_2O_3$ may form an ordered structure, as observed for dopant stabilized δ-$Bi_2O_3$. This ordering of oxygen is expected to result in some lowering of the conductivity. In larger area samples of δ-$Bi_2O_3$, prepared using overlapped laser scans which results in reannealing δ-phase areas at lower temperatures, additional diffraction peaks are observed that are consistent with simulations of oxygen-ordered δ-$Bi_2O_3$ (FIG. 13), suggesting that partial oxygen vacancy ordering may be responsible for the decreased conductivity and activation energy for room-temperature δ-$Bi_2O_3$ as compared with high-temperature extrapolations. Prior measurements of vacancy-ordered, dopant-stabilized δ-$Bi_2O_3$ have shown an increase in the activation energy for oxygen conduction rather than a decrease. It is possible that this increase is due to the attraction of oxygen ions to local strain or charge fields imposed by dopants, an effect that is absent in these laser-quenched pure δ-$Bi_2O_3$ films.

The data presented and discussed herein demonstrate the synthesis of embodiments of high quality compositionally and phase pure δ-$Bi_2O_3$ enabled by rapid laser quenching.

This material has low temperature oxygen conductivities orders of magnitude higher than previous best-in-class materials and preliminary results suggest a high degree of phase and conductivity stability at elevated temperatures. A range of processing conditions resulting in this low temperature δ-$Bi_2O_3$ were identified using the newly developed XPLAM technique, a powerful tool for discovering synthesis pathways to metastable materials. It is believed that this extremely conductive low temperature δ-$Bi_2O_3$ will spawn new classes of oxygen batteries, fuel cells, and sensors.

Materials and Methods

Deposition.

Figure 8:
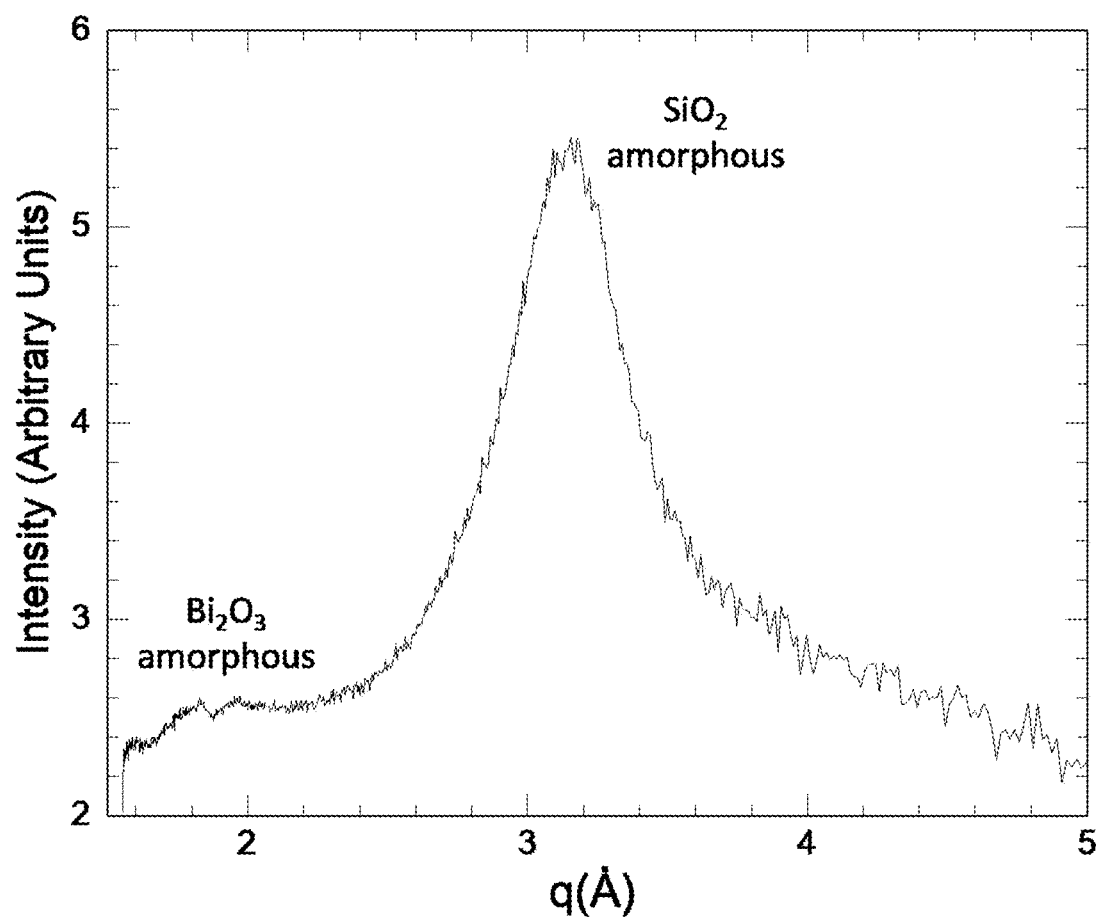
FIG. 8 is an X-ray diffraction pattern of as-deposited $Bi_2O_3$ on $SiO_2$ buffer layer on silicon single crystalline wafer.
Figure 9:
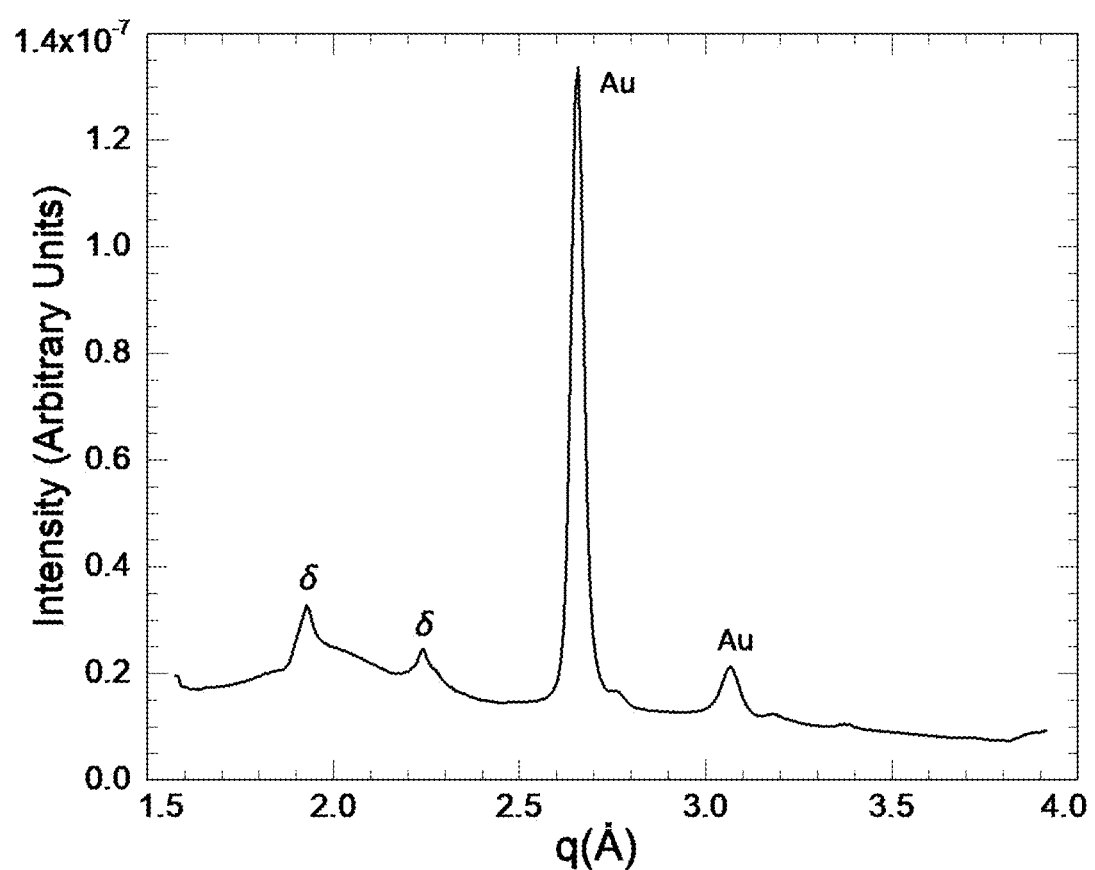
FIG. 9 is an X-ray diffraction pattern of $\delta$-$Bi_2O_3$ device with Au top contact demonstrating preservation of $\delta$-phase after full device patterning.
Figure 10:
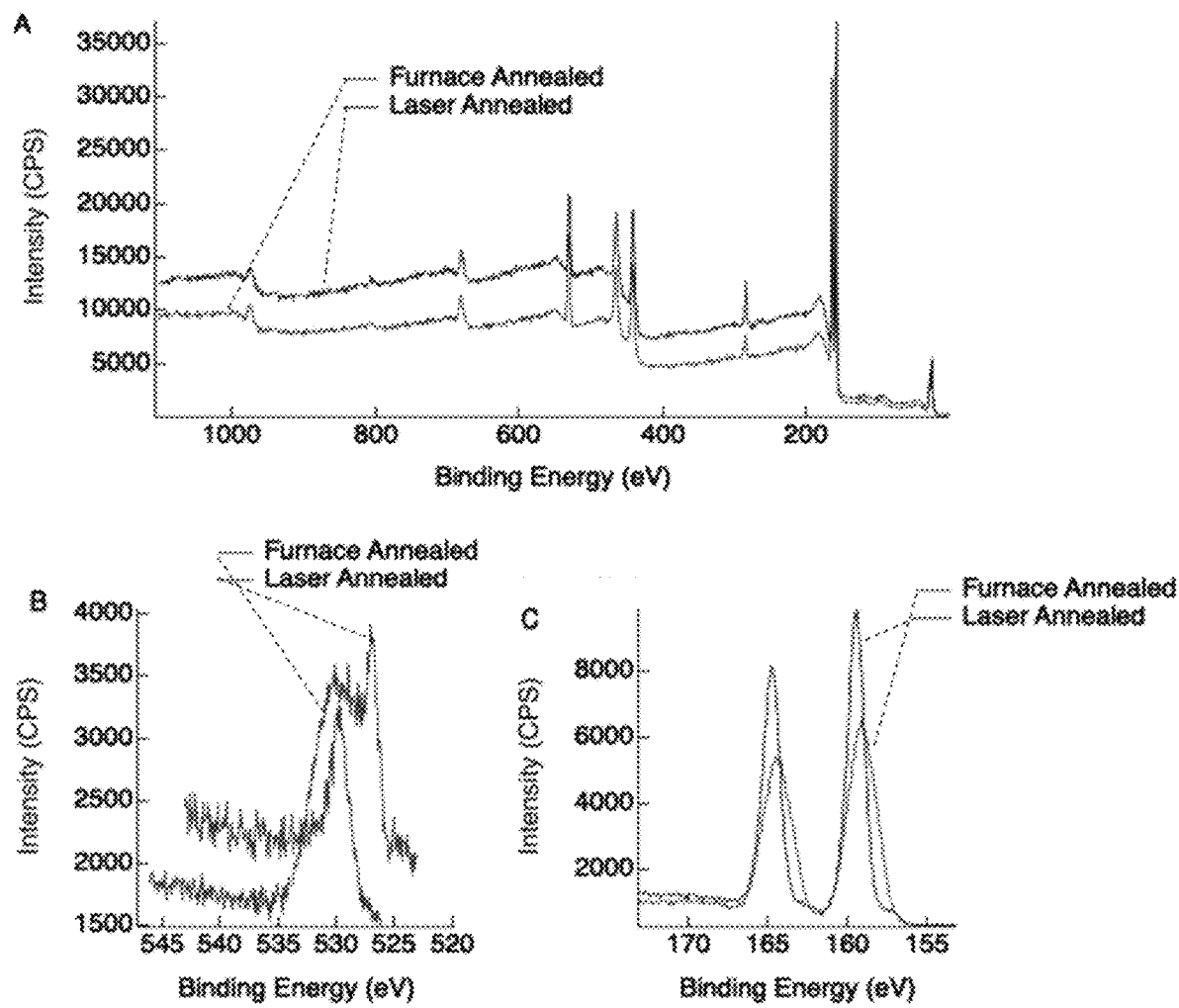
FIGS. 10A-C depict X-ray photoelectron spectroscopy of furnace annealed and laser annealed $Bi_2O_3$. The survey scan (10A) and high-resolution bismuth 4f (10C) scan do not show substantial differences between the two samples, consistent with no change in the stoichiometry between the two conditions. The origin of a 1-2 eV shift in the high-resolution oxygen 1s (10B) scan is unknown, but may be related to sample charging. The sharp peak at ca. 527 eV in the laser-annealed oxygen is attributed to carbonate adsorption.

Sample films of $Bi_2O_3$ were sputtered from a metallic Bi target (>99.99%) in an argon and oxygen plasma onto silicon wafers (p type, 0.01 Ω-cm, WRS Materials) with a 5-100 nm thermal $SiO_2$ buffer layer. $Bi_2O_3$ thickness for all films in this study was within the range 140-180 nm to optimize the laser annealing. No thickness-dependent variations were observed within this range. The substrate was unheated during sputtering, and the as-deposited $Bi_2O_3$ was amorphous (FIG. 8). The thermal $SiO_2$ buffer layer between the silicon wafer and $Bi_2O_3$ was used to prevent melt alloying with the silicon wafer for laser scans where temperatures exceed the 830° C. $Bi_2O_3$ melting temperature. Melt alloying of $Bi_2O_3$ and $SiO_2$ is known to precipitate a stable body centered cubic bismuth silicate phase with a melting point near 900° C. at low silicon concentrations; this phase was not observed for melt anneals in this study. On these time scales, the $SiO_2$ buffer layer appears to successfully prevent alloying of the $Bi_2O_3$ films even during melt. Samples used for structural analysis had a 100 nm thermal $SiO_2$ buffer, while samples used for electrical conductivity measurements had a thinner, 5 nm $SiO_2$ buffer layer. The phase pure δ-$Bi_2O_3$ in the devices used for electrical measurements was verified by XRD (FIG. 9). After laser annealing and X-ray analysis, and prior to device patterning, an additional 5 nm of $SiO_2$ was deposited using electron beam evaporation from an $SiO_2$ target as a capping layer on top of the $Bi_2O_3$ film to protect films from solvents during photolithographic patterning of electrical contacts. Thermal evaporation was used to deposit adhesion layers (1 nm Cr) and gold top and bottom contacts (30 nm). To verify that the bismuth oxide did not undergo stoichiometric shifts during laser processing, X-ray photoelectron spectroscopy was used to probe both the Bi oxidation state (FIGS. 10A-C) as well as the overall Bi/O ratio in the films; the measurements gave ca. 65% oxygen for a furnace-annealed sample as compared with ~62% for an area-annealed sample, well within the ca ±5% error of the measurement and consistent with a stoichiometry of $Bi_2O_3$.

Laser Annealing.

Figure 3:
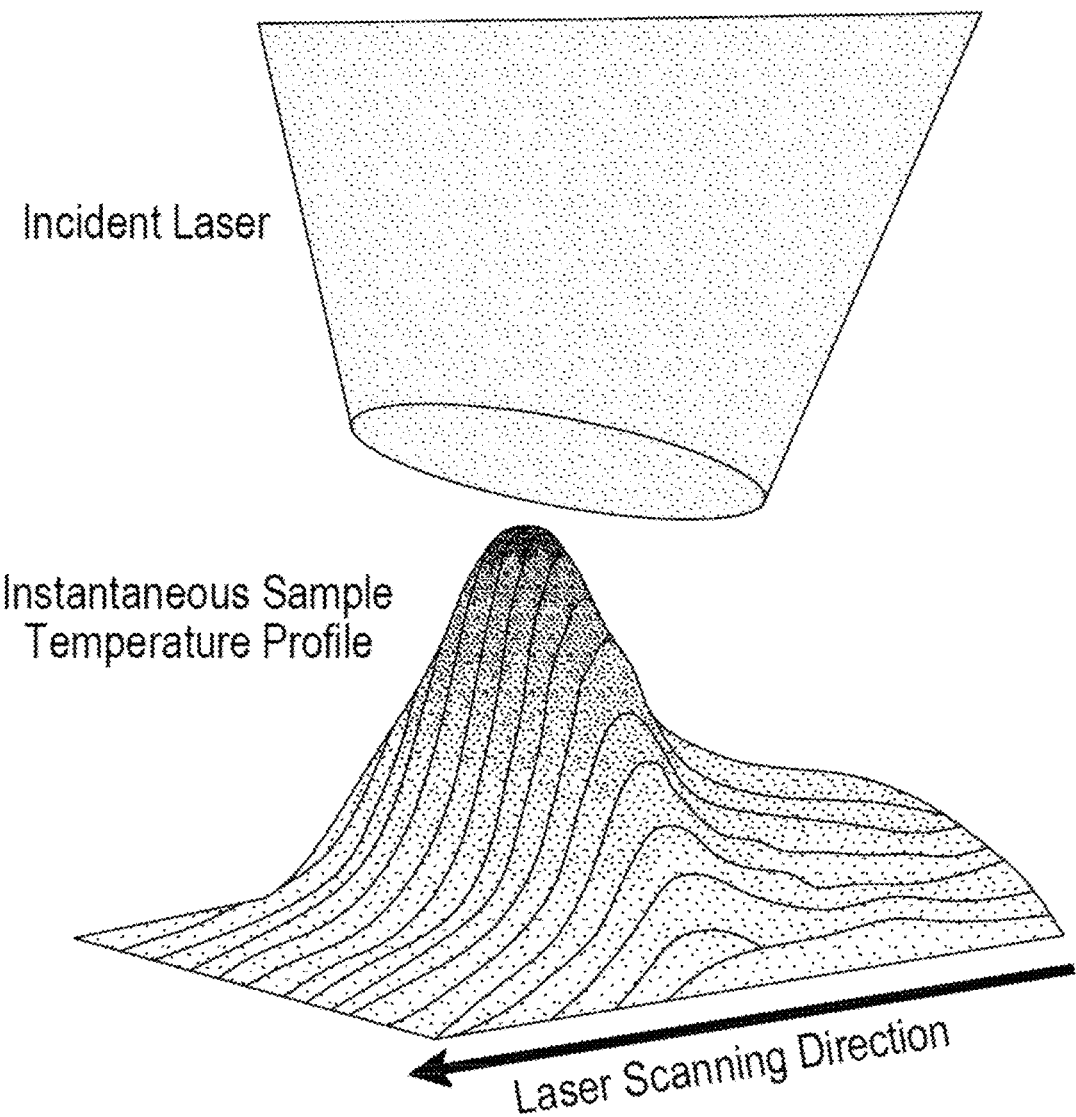
FIG. 3 is a diagram of a lateral gradient laser spike annealing (lgLSA) process showing scanning of the laser over a $Bi_2O_3$ sample and the instantaneous temperature profile.

Laser spike annealing was performed by scanning a continuous 10.6 μm wavelength line-focused $CO_2$ laser across the $Bi_2O_3$ sample, as shown in FIG. 3. The dwell time, a measure of annealing duration, is defined as the full width at half maximum (FWHM) of the laser intensity profile in the scanning direction divided by the scanning speed. All anneals were performed in air. Temperature evolution as a function of time across the entire scan width was measured. The peak temperature experienced across the laser scan width is approximately Gaussian with a maximum temperature near 900° C., maximum slope of 2° C./μm and a FWHM of 680 μm. The $Bi_2O_3$ thickness dependent perturbation to surface temperature was calibrated by $Bi_2O_3$ and Au dot melts. Laser scans create a line of annealed material where annealing conditions are invariant along the scan length but vary across the scan width. This allows the use of high aspect ratio rectangular areas for both X-ray diffraction and ion conduction measurements, with large areas of comparable annealing conditions despite the steep temperature gradient across the scan width. On the same sample, multiple spatially separated scans were made with dwells of 0.15-10 ms and peak temperatures in the scan centers of about 900° C., and center-center separations of 3 mm. This allowed high throughput measurements of annealing times and temperature conditions on a single sample using spatially resolved measurements.

Figure 4:
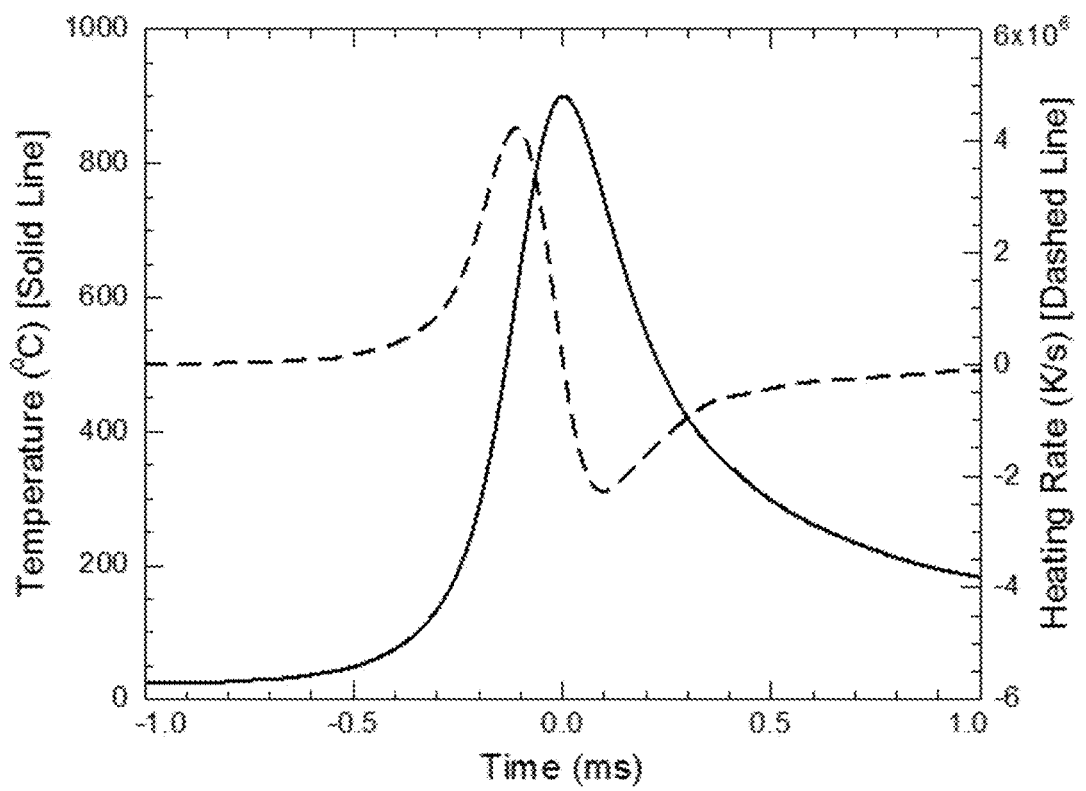
FIG. 4 is a chart showing time, temperature, and heating rate profile for a 0.15 ms dwell anneal with a peak temperature of 900° C. and peak quench rate of ~$2 \times 10^6$ K/s.

FIG. 4 is a chart showing time, temperature, and heating rate profile for a 0.15 ms dwell anneal with a peak temperature of 900° C. and peak quench rate of ~2×$10^6$ K/s.

Figure 5:
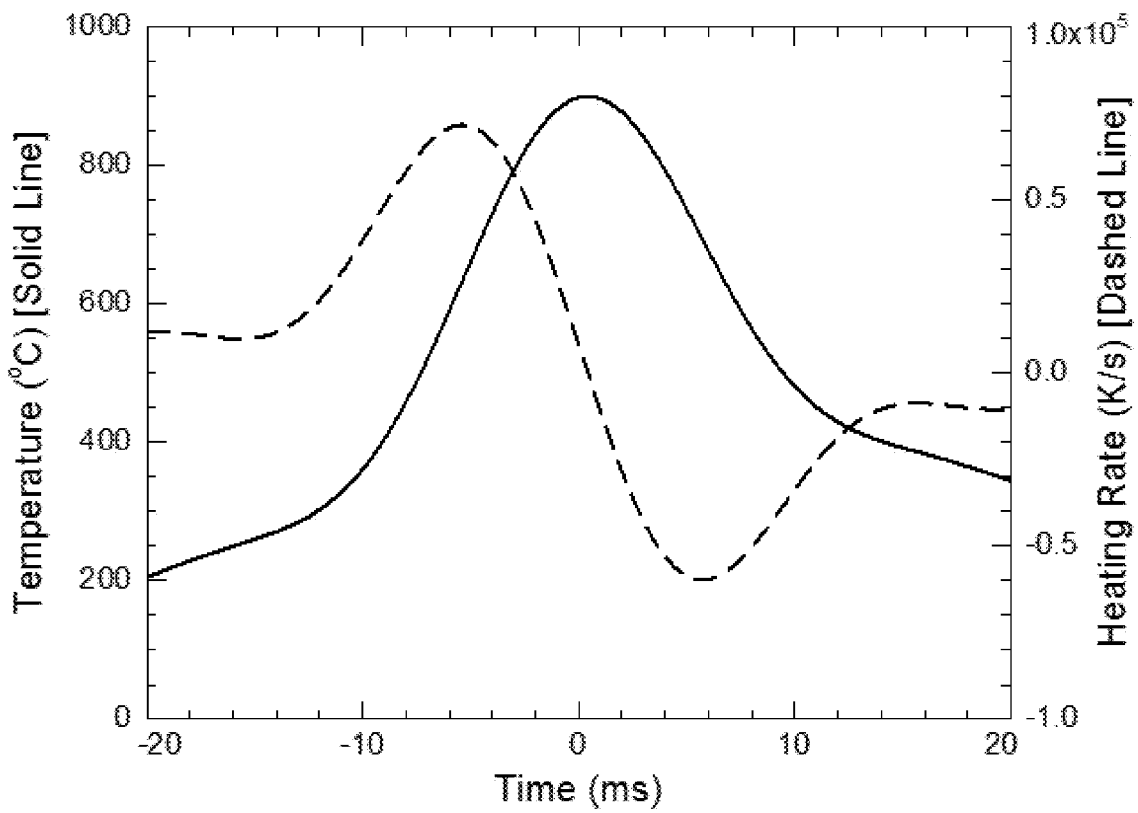
FIG. 5 is a chart showing time, temperature, and heating rate profile for a 2 ms dwell anneal with a peak temperature of 900° C. and peak quench rate of ~$7 \times 10^4$ K/s.

FIG. 5 is a chart showing time, temperature, and heating rate profile for a 2 ms dwell anneal with a peak temperature of 900° C. and peak quench rate of ~7×$10^4$ K/s.

The morphology of the annealed areas was examined using a scanning electron microscope (SEM). FIG. 6 gives an SEM image of a 1 ms dwell 900° C. peak temperature laser scan.

Phase Identification.

X-ray diffraction measurements were conducted using a Pilatus 300 k detector and 9.8 keV X-rays at the Cornell High Energy Synchrotron Source (CHESS). The X-ray beam was reduced to a 25×200 μm rectangle using a standard three-slit setup. The sample was mounted in a near-grazing-incidence configuration (angle of incidence ω=3°) and aligned such that the temperature gradient across the laser scans was orthogonal to the incident beam, allowing diffraction measurements to be spatially indexed to precise temperature (averaging over a 0-50° C. temperature range) and dwell annealing conditions. Diffracted X-rays were collected on a Pilatus3-300K pixel array detector (Dectris, Inc.). The incident X-ray beam energy was 9.81 keV and the typical sample-detector distance was 20 cm; precise sample-detector distances were calibrated using copper tape adhered to each end of each sample. Radial integration was performed using the Nika package for Igor Pro. An average of the amorphous $SiO_2$ peak near 3 Å$^{-1}$ (FIG. 8) was taken and subtracted for all diffraction patterns on a sample to sample basis to better allow phase identification. The peak markings in FIG. 11C correspond to International Crystal Structure Database (FIZ Karlsruhe) entries 2374, 41764, and 98144 for α, β, and δ, respectively. The beta and delta patterns were modified with an isotropic strain to better match the experimental data (ca. −2% for δ and −0.8% for β). This strain is well within other observations of these phases and consistent with thermal expansion mismatch over the ca. 800° C. quench from high-temperature formation to subsequent room-temperature measurements. The fraction of polymorphs present in each diffraction pattern was determined by multi-peak fitting and scaled relative to phase-pure patterns. For FIG. 12A, if a single phase's signal was more than 25% higher than all other phases, it was designated as dominant. If two phases had intensities within 25%, then the sample was identified as mixed phase. Fits in FIG. 11D were developed using even polynomials to force symmetry of the fit for equivalent annealing conditions on either side of the laser scan, and were transformed into temperature for FIG. 11E using lgLSA calibrations. 3D surfaces used to create contour plots in FIGS. 12B-D were developed using fitting shown in FIG. 11E. The reported limit on coherent scattering domain size was determined using the Debye-Scherrer equation assuming zero instrumental broadening and, as such, represents a lower limit on domain size. Prolonged anneals above the equilibrium melt resulted in damage in the form of an amorphous structure with a shifted amorphous peak compared to the as-deposited amorphous film, likely due to the well reported instability of $Bi_2O_3$ in low oxygen partial pressure environments at high temperatures.

Figure 13:
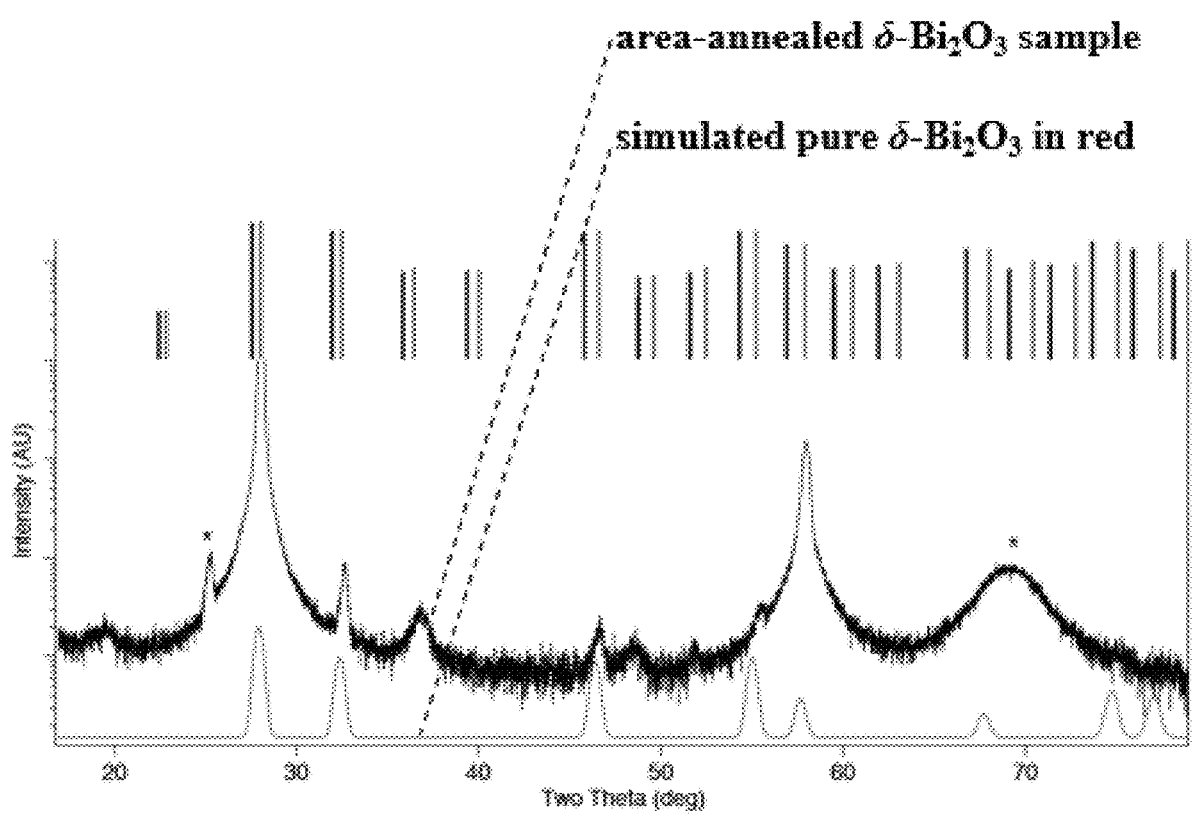
FIG. 13 shows a diffraction pattern of area-annealed $\delta$-$Bi_2O_3$ sample compared to simulated pure $\delta$-$Bi_2O_3$ and computationally predicted oxygen-ordered $\delta$-$Bi_2O_3$ both in the zero-stress state simulated (dark lines) and strained to match the $\delta$-$Bi_2O_3$ peaks that were observed (lighter lines) (the lines start with a dark line then alternate dark-light thereafter). The area-annealed $\delta$-$Bi_2O_3$ exhibits peaks corresponding to all of the disordered $\delta$-$Bi_2O_3$ peaks, plus additional peaks from symmetry breaking particularly noticeable in the (024), (006), and (062) reflections at ca. 36°, 49°, and 54°. The broad peak near 70° (*) is due to the $SiO_2$ underlayer and the peak near 25.2° (*) is a doubling of the primary $\delta$ peak caused by the $K_\beta$ X-ray source.

Large area anneals were created by using multiple offset line anneals where line anneals were offset 50 μm center-to-center over 40 mm wide areas (801 independent anneals). Each anneal stripe used the single scan LSA (ssLSA) conditions of 900° C. peak temperature and 250 μs dwells. As the annealing front moves across the annealed area, previously annealed areas experience 250 μs dwells at lower and lower temperatures until the annealing front has moved too far away to impact the material (~2 mm). A diffraction pattern from this area annealed δ-region is shown in FIG. 13 along with expected peak positions for the computationally predicted oxygen-ordered δ-phase.

Scanning Electron Microscopy.

The morphology of the annealed areas was examined using a Tescan Mira3 scanning electron microscope (SEM) using an in-lens detector and an accelerating voltage of 15 kV. The laser scan image in FIG. 6 had a 1 ms dwell and 900° C. peak temperature.

X-Ray Photoelectron Spectroscopy.

XPS measurements were performed on a Surface Science Instruments SSX-100. The resulting data were charge-compensated by adjusting the position of the adventitious C 1s peak to 184 eV. The composition results were determined by integrating the O 1s peak (deconvolved from adsorbed carbonate contributions) and the Bi 4f 5/2 peak; the Bi 4f 7/2 peak was not used due to possible contributions from the Bi 5s shell.

Electrical Measurements and Devices.

Figure 2A:
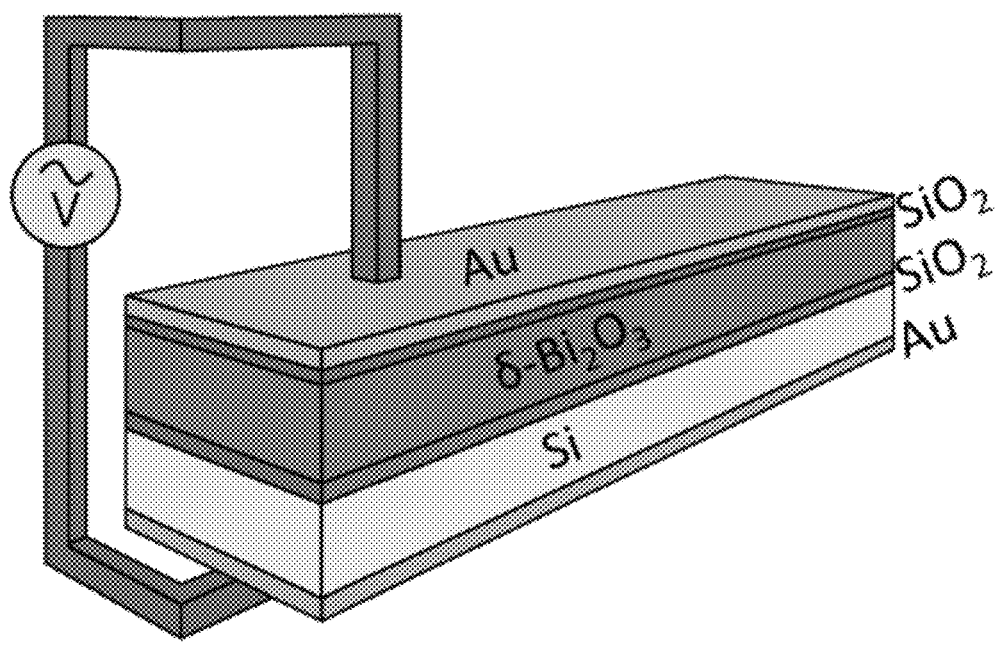
FIGS. 2A-D show a setup for taking impedance spectroscopy measurements of an embodiment of $\delta$-$Bi_2O_3$ (A), and measured frequency dependent real and imaginary impedance (B-D).
Figure 2B:
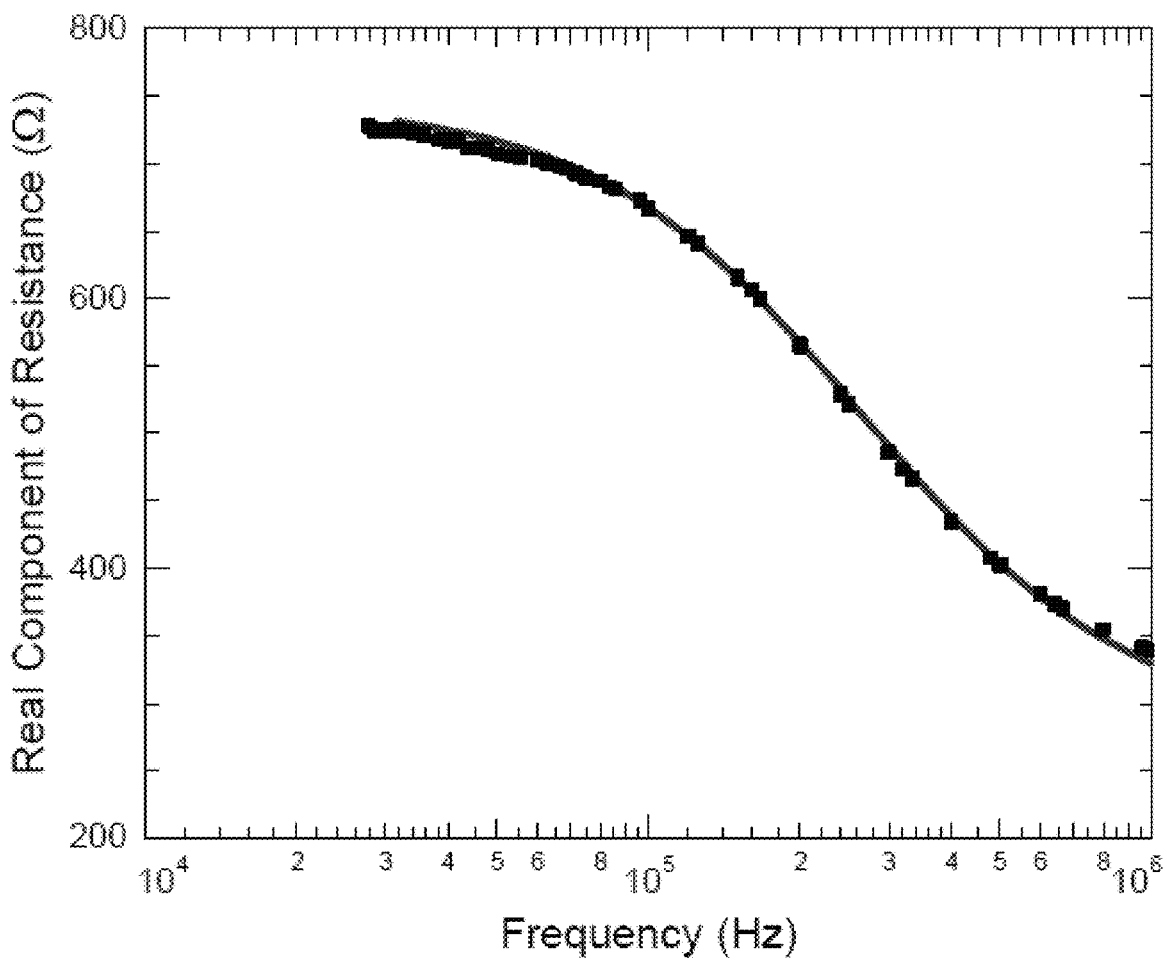
Figure 2C:
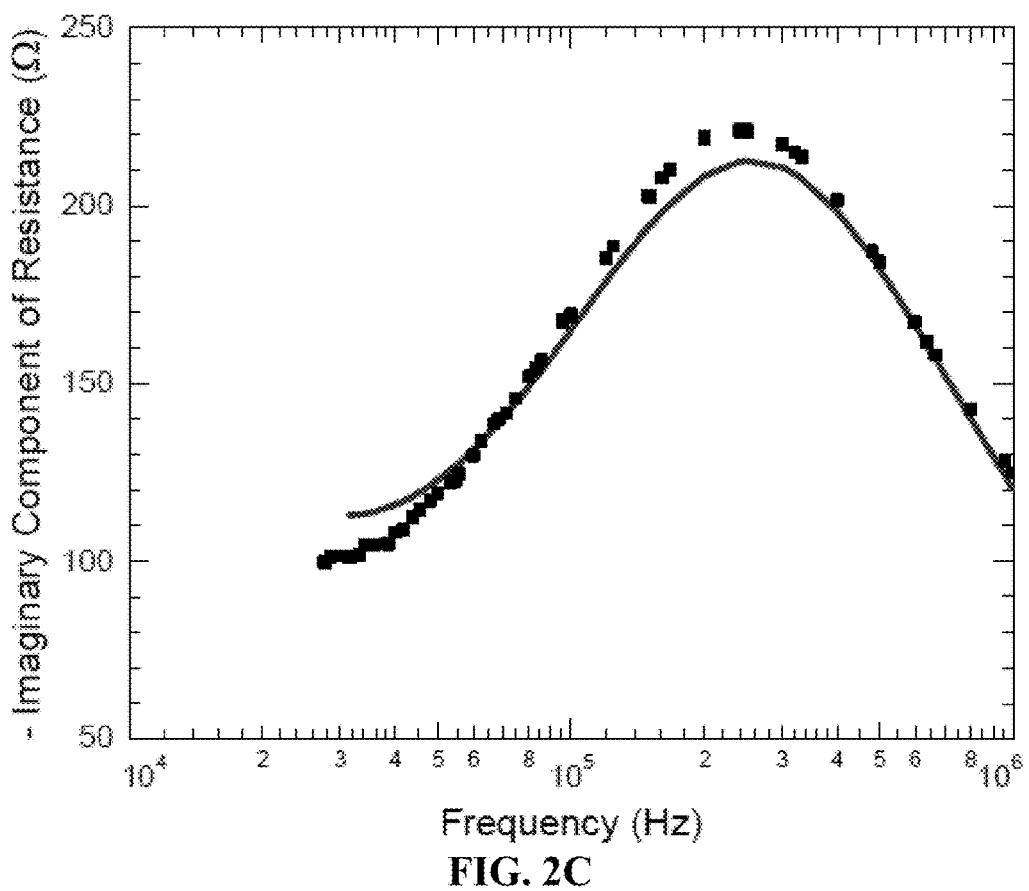
Figure 2D:
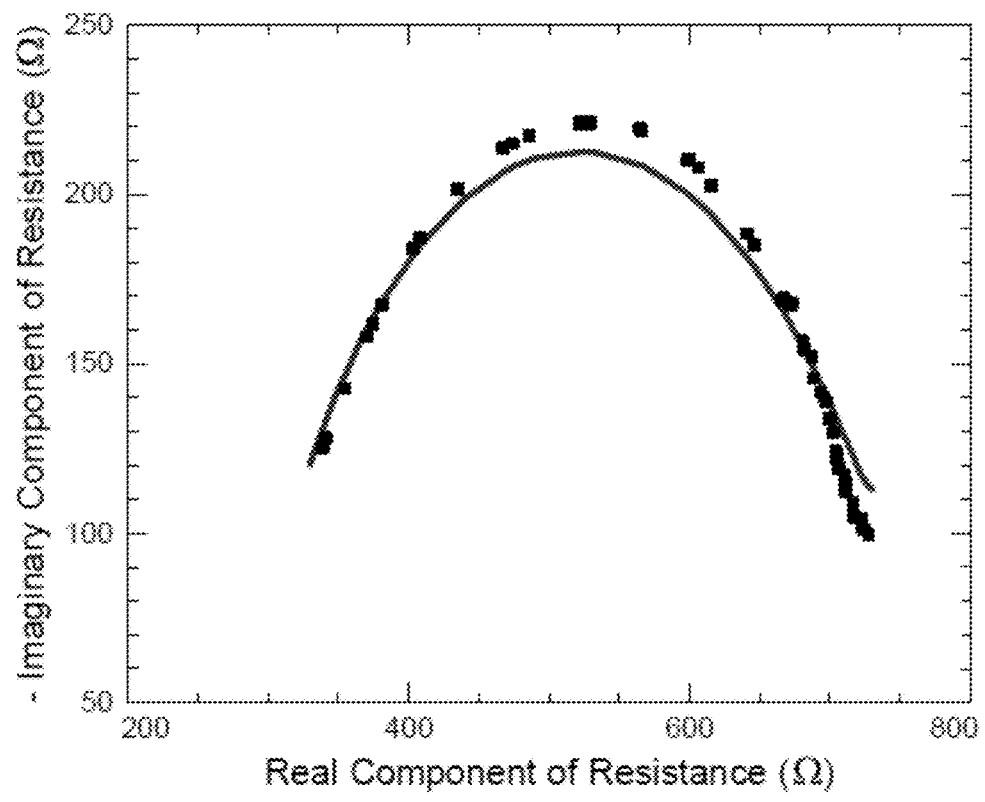

Devices with a $Bi_2O_3$ contact area of 0.328 $mm^2$ were constructed on areas of 160 nm thick $\delta$-$Bi_2O_3$ generated by lgLSA to a peak temperature of 850° C. with a 0.25 ms dwell (FIG. 2A). Conductivity was determined by impedance spectroscopy using a 4284A HP LCR meter. FIG. 2A is a schematic of $\delta$-$Bi_2O_3$ devices tested via impedance spectroscopy. Devices were lithographically patterned and consisted of a stack ($Au/SiO_2/Bi_2O_3/SiO_2/Si/Au$) as shown in FIG. 2A, where contact was made to the front and back of the device. Using gold contacts, impedance spectroscopy measurements from 25 kHz to 1 MHz were made at room temperature using a parallel resistor and constant phase element ($Bi_2O_2$ film) in series with a parallel resistance and capacitance circuit ($SiO_2$ buffer layers) and series resistor (substrate). Measured data (squares) and results from modeling the circuit in FIG. 2A (lines) are shown in FIGS. 2B-2D. FIG. 2B shows the real component of measured resistance as a function of frequency. FIG. 2C shows an imaginary component of measured resistance as a function of frequency. FIG. 2D shows real vs. imaginary measured resistances showing a semicircle shape typical of ionic conductors. Data were fit using a parallel resistor and constant phase element model for the $Bi_2O_3$ layer, yielding a room temperature (25° C.) conductivity of $10^{-5.05 \pm 0.03}$ S/cm for $\delta$-$Bi_2O_3$. FIG. 7 shows resultant test data for the measured conductivity of the inventive $\delta$-$Bi_2O_3$ embodiment (shown in black squares), as well as previously measured conductivity (by others) of $\delta$-$Bi_2O_3$ (at higher temperatures), and comparative data for $\alpha$-$Bi_2O_3$ and other compositions.

The measured conductivity of $10^{-5.05 \pm 0.03}$ S/cm for the tested $\delta$-$Bi_2O_3$ is over 6 orders of magnitude above the conductivity of the room temperature stable $\alpha$-phase ($10^{-11.9}$ S/cm). This room temperature conductivity is also orders of magnitude higher than any other inorganic oxygen ion conducting material. For example, extrapolations of data to room temperature suggest a conductivity of $10^{-13}$ S/cm for YSZ (Laurent et al., Structure and Conductivity Studies of Electrodeposited $\delta$-$Bi_2O_3$, Solid State Ionics 2008, 178 (33-34), 1735-1739), $10^{-6.8}$ S/cm for $Bi_2V_{1.9}Cu_{0.1}O_{5.35}$ (Skinner et al., Oxygen Ion Conductors, Mater. Today 2003, 6 (3), 30-37), $10^{-7.5}$ S/cm for Pb and Y stabilized $\delta$-$Bi_2O_3$ (Borowska-Centkowska et al., Conductivity in Lead Substituted Bismuth Yttrate Fluorites, Solid State Ionics 2014, 254, 59-64), and $10^{-8.4}$ S/cm for Er stabilized $\delta$-$Bi_2O_3$ (Jiang et al., Structural Stability and Conductivity of Phase-Stabilized Cubic Bismuth Oxides. J. Am. Ceram. Soc. 1999, 82 (11), 3057-3064). These results are indicative of an exciting, novel, highly conductive room temperature stable $\delta$-phase $Bi_2O_3$ composition that enables for the first time, inter alia, low temperature $Bi_2O_2$ devices.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), "contain" (and any form contain, such as "contains" and "containing"), and any other grammatical variant thereof, are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a composition or article that "comprises", "has", "includes" or "contains" one or more features possesses those one or more features, but is not limited to possessing only those one or more features.

As used herein, the terms "comprising," "has," "including," "containing," and other grammatical variants thereof encompass the terms "consisting of" and "consisting essentially of."

The phrase "consisting essentially of" or grammatical variants thereof when used herein are to be taken as specifying the stated features, integers, steps or components but do not preclude the addition of one or more additional features, integers, steps, components or groups thereof but only if the additional features, integers, steps, components or groups thereof do not materially alter the basic and novel characteristics of the claimed composition, device or method.

All publications cited in this specification are herein incorporated by reference as if each individual publication were specifically and individually indicated to be incorporated by reference herein as though fully set forth.

Subject matter incorporated by reference is not considered to be an alternative to any claim limitations, unless otherwise explicitly indicated.

Where one or more ranges are referred to throughout this specification, each range is intended to be a shorthand format for presenting information, where the range is understood to encompass each discrete point within the range as if the same were fully set forth herein.

While several aspects and embodiments of the present invention have been described and depicted herein, alternative aspects and embodiments may be affected by those skilled in the art to accomplish the same objectives. Accordingly, this disclosure and the appended claims are intended to cover all such further and alternative aspects and embodiments as fall within the true spirit and scope of the invention.

The invention claimed is:

1. A method of making an ion conductive composition comprising δ-phase $Bi_2O_3$, said method comprising heating $Bi_2O_3$ to at least 730° C., then cooling the material to less than or equal to 400° C., wherein, during said cooling, the temperature of the material is reduced from 650° C. to less than or equal to 400° C. within 100 ms or less, thereby obtaining δ-phase $Bi_2O_3$ wherein the composition comprises at least 95 wt % $Bi_2O_3$ and, at 25° C., the composition is stable and has a conductivity of at least $10^{-7}$ S/cm.

2. The method according to claim 1, wherein said heating $Bi_2O_3$ to at least 730° C. comprises heating the $Bi_2O_3$ to at least 830° C.

3. The method according to claim 1, wherein said cooling the material to less than or equal to 400° C. comprises cooling the material to less than or equal to 250° C.

4. The method according to claim 1, comprising, during said cooling, the temperature of the material is reduced from 650° C. to less than 400° C. within 50 ms or less.

5. A method of making a bismuth oxide composition comprising heating a first $Bi_2O_3$ material having a first phase to at least 730° C., then cooling the material to less than or equal to 400° C., wherein, during said cooling, the temperature of the material is reduced from 650° C. to less than or equal to 400° C. within 100 ms or less, to obtain a second $Bi_2O_3$ material having a second phase.

6. A method according to claim 5, wherein the second $Bi_2O_3$ material having the second phase comprises a δ-phase $Bi_2O_3$.

7. A method according to claim 5, wherein the first $Bi_2O_3$ material having the first phase comprises an amorphous phase $Bi_2O_3$.

8. The method according to claim 5, wherein the second $Bi_2O_3$ material having the second phase is an ion conductive composition comprising at least 95 wt % $Bi_2O_3$ and, at 25° C., the composition is stable and has a conductivity of at least $10^{-7}$ S/cm.

9. The method according to claim 5, wherein said composition is stable for at least one year at 25° C.

10. The method according to claim 5, wherein the composition comprises greater than or equal to 99 wt % of the δ-phase $Bi_2O_3$.

11. The method according to claim 5, wherein the composition comprises greater than 99.9 mole % of the δ-phase $Bi_2O_3$.

12. The method according to claim 5, wherein the composition does not comprise titanium, manganese, lead, yttrium, or erbium.

13. The method according to claim 5, wherein said composition is pinhole free.

14. The method according to claim 5, wherein at least 99 vol % of said composition is pinhole free.

15. The method according to claim 5, wherein the composition has a conductivity of $10^{-7}$ to $10^{-3}$ S/cm.

16. The method according to claim 5, wherein said composition comprises substantially single phase $Bi_2O_3$ that comprises less than 1 vol % and/or less than 1 wt % of any secondary $Bi_2O_3$ phases.

17. The method according to claim 5, wherein the composition has a grain size of 4 nm to 1,000,000 nm.

18. The method according to claim 5, further comprising forming a film comprising the composition.

19. The method according to claim 18, wherein the film has a thickness of 10 nm to 10,000 nm.

20. The method according to claim 5, further comprising forming an electrochemical device comprising the composition.

21. The method according to claim 20, wherein the composition is in the form of a monolithic film.

22. The method according to claim 20, wherein said device comprises a solid oxide fuel cell (SOFC), an oxygen sensor, or a metal-air battery.

* * * * *